US009767867B2

(12) United States Patent
Okin et al.

(10) Patent No.: US 9,767,867 B2
(45) Date of Patent: Sep. 19, 2017

(54) METHODS OF COMMUNICATING TO DIFFERENT TYPES OF MEMORY MODULES IN A MEMORY CHANNEL

(71) Applicant: Virident Systems, LLC, San Jose, CA (US)

(72) Inventors: Kenneth Alan Okin, Saratoga, CA (US); George Moussa, Dublin, CA (US); Kumar Ganapathy, Los Altos, CA (US); Vijay Karamcheti, Los Altos, CA (US); Rajesh Parekh, Los Altos, CA (US)

(73) Assignee: Virident Systems, Inc., San Jose, CA (US)

( * ) Notice: Subject to any disclaimer, the term of this patent is extended or adjusted under 35 U.S.C. 154(b) by 108 days.

(21) Appl. No.: 14/016,202

(22) Filed: Sep. 2, 2013

(65) Prior Publication Data

US 2014/0075106 A1    Mar. 13, 2014

Related U.S. Application Data

(62) Division of application No. 11/864,823, filed on Sep. 28, 2007.

(60) Provisional application No. 60/956,681, filed on Aug. 17, 2007, provisional application No. 60/827,421, filed on Sep. 28, 2006, provisional application No. 60/862,597, filed on Oct. 23, 2006.

(51) Int. Cl.
*G11C 7/10* (2006.01)
*G06F 13/16* (2006.01)
*G11C 5/04* (2006.01)

(52) U.S. Cl.
CPC ........ *G11C 7/1072* (2013.01); *G06F 13/1694* (2013.01); *G11C 5/04* (2013.01)

(58) Field of Classification Search
CPC ...... G11C 7/1072; G11C 5/04; G06F 13/1694
USPC .............................. 711/101, E12.002; 713/1
See application file for complete search history.

(56) References Cited

U.S. PATENT DOCUMENTS 5,235,551 A * 8/1993 Sinofsky et al. ............... 365/94
5,860,134 A * 1/1999 Cowell ......................... 711/172
(Continued)

OTHER PUBLICATIONS

Gordon, Whitson, "Do I really need to update my drivers", May 23, 2012.*
Support and Dowloads, Intel, Indexed on Sep. 23, 2005.*

*Primary Examiner* — Edward Dudek, Jr.
(74) *Attorney, Agent, or Firm* — Afford Law Group, Inc.; Tobi C. Clinton

(57) ABSTRACT

A computer system is disclosed including a printed circuit board (PCB) including a plurality of traces, at least one processor mounted to the PCB to couple to some of the plurality of traces, a heterogeneous memory channel including a plurality of sockets coupled to a memory channel bus of the PCB, and a memory controller coupled between the at least one processor and the heterogeneous memory channel. The heterogeneous memory channel includes a plurality of sockets coupled to a memory channel bus of the PCB. The plurality of sockets are configured to receive a plurality of different types of memory modules. The memory controller may be a programmable heterogeneous memory controller to flexibly adapt to the memory channel bus to control access to each of the different types of memory modules in the heterogeneous memory channel.

15 Claims, 22 Drawing Sheets

(56) References Cited

U.S. PATENT DOCUMENTS

| | | | |
|---|---|---|---|
| 7,266,667 B2* | 9/2007 | Oh | 711/200 |
| 2004/0098549 A1* | 5/2004 | Dorst | 711/167 |

* cited by examiner

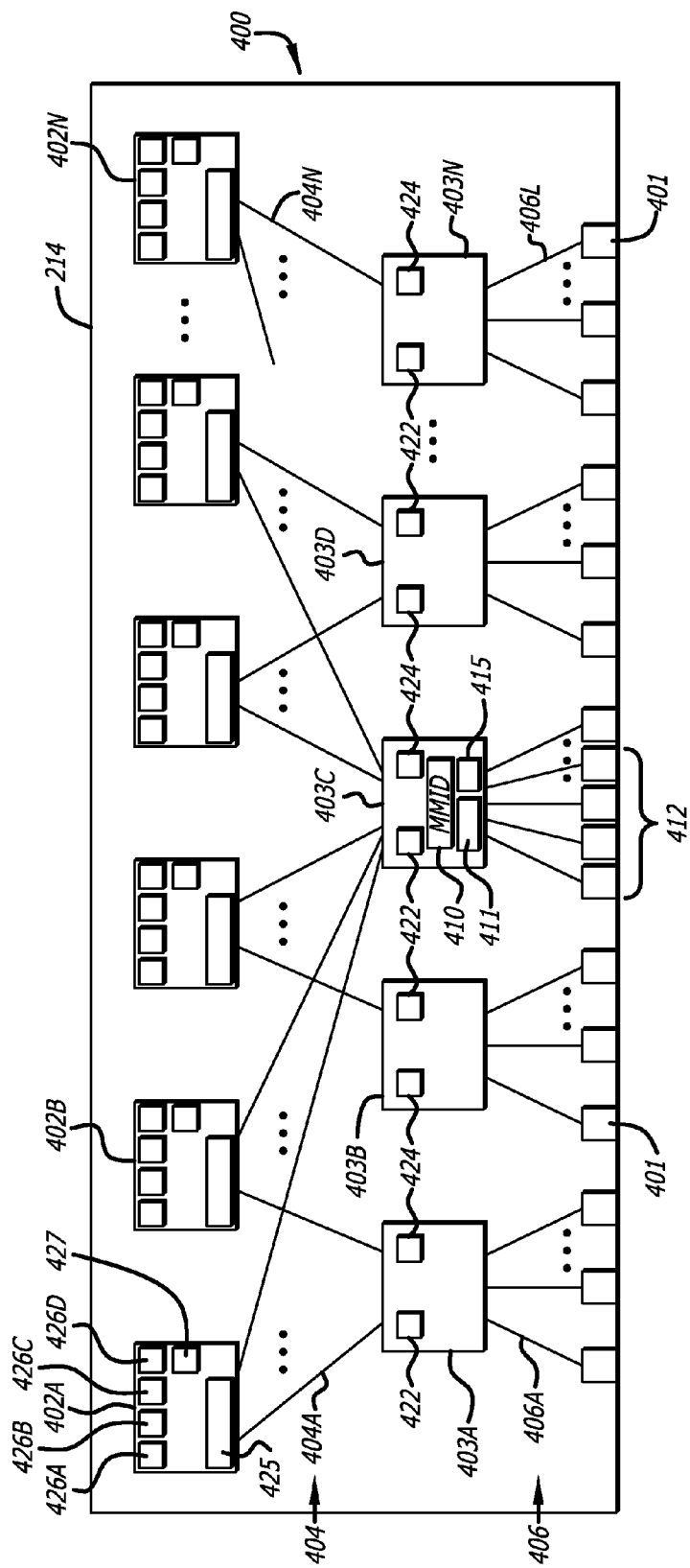

| SOCKET/MC | MC1 | MC2 | | MCn |
|---|---|---|---|---|
| S1 | SRAM1 | SRAM2 | | DRAM1 |
| S2 | NVRAM4 | Empty | | DRAM2 |
| S3 | DRAM6 | SRAM2 | ... | DRAM2 |
| S4 | DRAM2 | SRAM2 | | DRAM1 |
| Sm | DRAM1 | SRAM2 | | DRAM1 |

FIG. 11A

| PIN NO. | 1 | 2 | 3 | 4 | 5 | 6 | 7 | 8 | ... | N-2 | N-1 | N |
|---|---|---|---|---|---|---|---|---|---|---|---|---|
| I/O/B/P | P | P | I | I | I | I | B | B | | B | P | P |
| FUNC | V | G | C1 | C2 | A1 | A2 | D1 | D2 | | D8 | G | V |

FIG. 11B

| PIN NO. | 1 | 2 | 3 | 4 | 5 | 6 | 7 | 8 | ... | N-2 | N-1 | N |
|---|---|---|---|---|---|---|---|---|---|---|---|---|
| I/O/B/P | P | P | B | B | B | B | B | B | | B | P | P |
| FUNC | V | G | D1 | D2 | D3 | D4 | D5 | D6 | | D8 | NC | NC |

FIG. 11C

| PIN NO. | 1 | 2 | 3 | 4 | 5 | 6 | 7 | 8 | ... | N-2 | N-1 | N |
|---|---|---|---|---|---|---|---|---|---|---|---|---|
| I/O/B/P | P | P | I | I | B | B | B | B | | I | P | P |
| FUNC | V | G | A1 | A2 | D1 | D2 | D3 | D4 | | A8 | G | V |

FIG. 14-1

FLASH MODULE ON 240 PIN DDR2 SDRAM RDIMM

| | FRONT SIDE | | | | | BACK SIDE | | | |
|---|---|---|---|---|---|---|---|---|---|
| Pin | Signal Name | Pin Type | RDIMM Description | Signal Assigned | Pin | Signal Name | Pin Type | RDIMM Description | Signal Assigned |
| 1 | VREF | supply | SSTL_18 ref | VREF | 121 | VSS | supply | Ground | VSS |
| 2 | VSS | supply | Ground | VSS | 122 | DQ4 | I/O (SSTL18) | Data I/O | DQ4 |
| 3 | DQ0 | I/O (SSTL18) | Data I/O | DQ0 | 123 | DQ5 | I/O (SSTL18) | Data I/O | DQ5 |
| 4 | DQ1 | I/O (SSTL18) | Data I/O | DQ1 | 124 | VSS | supply | Ground | VSS |
| 5 | VSS | supply | Ground | Vss | 125 | DQS9 | I/O (SSTL18) | Data strobe | RY/BY_N_RD0 |
| 6 | DQS0# | I/O (SSTL18) | Data Strobe | LNK OVRD(1) | 126 | DQS9# | I/O (SSTL18) | Data strobe | NC |
| 7 | DQS0 | I/O (SSTL18) | Data Strobe | NC | 127 | VSS | supply | Ground | VSS |
| 8 | VSS | supply | Ground | VSS | 128 | DQ6 | I/O (SSTL18) | Data I/O | DQ6 |
| 9 | DQ2 | I/O (SSTL18) | Data I/O | DQ2 | 129 | DQ7 | I/O (SSTL18) | Data I/O | DQ7 |
| 10 | DQ3 | I/O (SSTL18) | Data I/O | DQ3 | 130 | VSS | supply | Ground | VSS |
| 11 | VSS | supply | Ground | VSS | 131 | DQ12 | I/O (SSTL18) | Data I/O | DQ12 |
| 12 | DQ8 | I/O (SSTL18) | Data I/O | DQ8 | 132 | DQ13 | I/O (SSTL18) | Data I/O | DQ13 |
| 13 | DQ9 | I/O (SSTL18) | Data I/O | DQ9 | 133 | VSS | supply | Ground | VSS |
| 14 | VSS | supply | Ground | VSS | 134 | DQS10 | I/O (SSTL18) | Data strobe | RY/BY_N_RD1 |
| 15 | DQS1# | I/O (SSTL18) | Data strobe | NC (GWY JTAG TDO) | 135 | DQS10# | I/O (SSTL18) | Data strobe | NC |
| 16 | DQS1 | I/O (SSTL18) | Data strobe | NC (GWY JTAG TDI) | 136 | VSS | supply | Ground | VSS |
| 17 | VSS | supply | Ground | VSS | 137 | RFU | | Reserved | NC |
| 18 | RESET# | Input (LVCMOS) | Reset | Sys_RESET_N | 138 | RFU | | Reserved | NC |
| 19 | NC | | | NC | 139 | VSS | supply | Ground | VSS |
| 20 | VSS | supply | Ground | VSS | 140 | DQ14 | I/O (SSTL18) | Data I/O | DQ14 |
| 21 | DQ10 | I/O (SSTL18) | Data I/O | DQ10 | 141 | DQ15 | I/O (SSTL18) | Data I/O | DQ15 |

FIG. 14-2

| 22 DQ11 | I/O (SSTL18) | Data I/O | DQ11 | 142 VSS | supply | Ground | VSS |
|---|---|---|---|---|---|---|---|
| 23 VSS | supply | Ground | VSS | 143 DQ20 | I/O (SSTL18) | Data I/O | DQ20 |
| 24 DQ16 | I/O (SSTL18) | Data I/O | DQ16 | 144 DQ21 | I/O (SSTL18) | Data I/O | DQ21 |
| 25 DQ17 | I/O (SSTL18) | Data I/O | DQ17 | 145 VSS | supply | Ground | VSS |
| 26 VSS | supply | Ground | VSS | 146 DQS11 | I/O (SSTL18) | Data strobe | RY/BY_N_R0D2 |
| 27 DQS2# | I/O (SSTL18) | Data strobe | CLK_RET_N_D2 | 147 DQS11# | I/O (SSTL18) | Data strobe | NC |
| 28 DQS2 | I/O (SSTL18) | Data strobe | CLK_RET_P_D2 | 148 VSS | supply | Ground | VSS |
| 29 VSS | supply | Ground | VSS | 149 DQ22 | I/O (SSTL18) | Data I/O | DQ22 |
| 30 DQ18 | I/O (SSTL18) | Data I/O | DQ18 | 150 DQ23 | I/O (SSTL18) | Data I/O | DQ23 |
| 31 DQ19 | I/O (SSTL18) | Data I/O | DQ19 | 151 VSS | supply | Ground | VSS |
| 32 VSS | supply | Ground | VSS | 152 DQ28 | I/O (SSTL18) | Data I/O | DQ28 |
| 33 DQ24 | I/O (SSTL18) | Data I/O | DQ24 | 153 DQ29 | I/O (SSTL18) | Data I/O | DQ29 |
| 34 DQ25 | I/O (SSTL18) | Data I/O | DQ25 | 154 VSS | supply | Ground | VSS |
| 35 VSS | supply | Ground | VSS | 155 DQS12 | I/O (SSTL18) | Data strobe | RY/BY_N_R0D3 |
| 36 DQS3# | I/O (SSTL18) | Data strobe | CLK_RET_N_D3 | 156 DQS12# | I/O (SSTL18) | Data strobe | NC |
| 37 DQS3 | I/O (SSTL18) | Data strobe | CLK_RET_P_D3 | 157 VSS | supply | Ground | VSS |
| 38 VSS | supply | Ground | VSS | 158 DQ30 | I/O (SSTL18) | Data I/O | DQ30 |
| 39 DQ26 | I/O (SSTL18) | Data I/O | DQ26 | 159 DQ31 | I/O (SSTL18) | Data I/O | DQ31 |
| 40 DQ27 | I/O (SSTL18) | Data I/O | DQ27 | 160 VSS | supply | Ground | VSS |
| 41 VSS | supply | Ground | VSS | 161 CB4 | I/O (SSTL18) | ECC | CB4 |
| 42 CB0 | I/O (SSTL18) | ECC | CB0 | 162 CB5 | I/O (SSTL18) | ECC | CB5 |
| 43 CB1 | I/O (SSTL18) | ECC | CB1 | 163 VSS | supply | Ground | VSS |
| 44 VSS | supply | Ground | VSS | 164 DQS17 | I/O (SSTL18) | Data strobe | NC (GWY_JTAG_EN) |
| 45 DQS8# | I/O (SSTL18) | Data strobe | NC (GWY_JTAG_TCK) | 165 DQS17# | I/O (SSTL18) | Data strobe | NC |
| 46 DQS8 | I/O (SSTL18) | Data strobe | NC (GWY_JTAG_TMS) | 166 VSS | supply | Ground | VSS |

FIG. 14-3

| 47 VSS | supply | Ground | 167 CB6 | I/O (SSTL18) | ECC | CB6 |
|---|---|---|---|---|---|---|
| 48 CB2 | I/O (SSTL18) | ECC | 168 CB7 | I/O (SSTL18) | ECC | CB7 |
| 49 CB3 | I/O (SSTL18) | ECC | 169 VSS | supply | Ground | VSS |
| 50 VSS | supply | Ground | 170 VDDQ | supply | DQ power supply | |
| 51 VDDQ | supply | DQ power supply | 171 CKE1 | input (SSTL18) | Clock enable | NC (GWY-VSS) |
| 52 CKE0 | input (SSTL18) | Clock enable | 172 VDD | supply | Power supply | |
| 53 VDD | supply | Power supply | 173 A15 | input (SSTL18) | Address input | CE3_N/A15 |
| 54 A16/BA2 | input (SSTL18) | Bank address | 174 A14 | input (SSTL18) | Address input | CE2_N/A14 |
| 55 ERR OUT | Output(open d | Parity Error | 175 VDDQ | supply | DQ power supply | |
| 56 VDDQ | supply | DQ power supply | 176 A12 | input (SSTL18) | Address input | A12/OE_N |
| 57 A11 | input (SSTL18) | Address input | A11/RESET_N | 177 A9 | input (SSTL18) | Address input | A9/A26 |
| 58 A7 | input (SSTL18) | Address input | A7/A24 | 178 VDD | supply | Power supply | |
| 59 VDD | supply | Power supply | | 179 A8 | input (SSTL18) | Address input | A8/A25 |
| 60 A5 | input (SSTL18) | Address input | A5/A22 | 180 A6 | input (SSTL18) | Address input | A6/A23 |
| 61 A4 | input (SSTL18) | Address input | A4/A21 | 181 VDDQ | supply | DQ power supply | |
| 62 VDDQ | supply | DQ power supply | | 182 A3 | input (SSTL18) | Address input | A3/A20 |
| 63 A2 | input (SSTL18) | Address input | A2/A19 | 183 A1 | input (SSTL18) | Address input | A1/A18/SDEL 1 |
| 64 VDD | supply | Power supply | | 184 VDD | supply | Power supply | |
| KEY WAY | | | | KEY WAY | | | |
| 65 VSS | supply | Ground | VSS | 185 CK0 | input (SSTL18) | Clock | CLK_N |
| 66 VSS | supply | Ground | VSS | 186 CK0# | input (SSTL18) | Clock | CLK_P |
| 67 VDD | supply | Power supply | | 187 VDD | supply | Power supply | |
| 68 PAR_IN | input (SSTL18) | Parity Bit | NC | 188 A0 | input (SSTL18) | Address input | A0/A17/DSEL 0 |
| 69 VDD | supply | Power supply | | 189 VDD | supply | Power supply | |
| 70 A10/AP | input (SSTL18) | Address input | A10/A27 | 190 BA1 | input (SSTL18) | Bank address | CMD1 |

FIG. 14-4

| | | | | | | | | |
|---|---|---|---|---|---|---|---|---|
| 71 BA0 | input (SSTL18) | Bank address | CE0_N/AVD_N | 191 VDDQ | supply | DQ power supply | | |
| 72 VDDQ | supply | DQ power supply | | 192 RAS# | input (SSTL18) | Command input | CMD0 | |
| 73 WE# | input (SSTL18) | Command input | DIMM_ADDR0/ODT0 | 193 S0# | input (SSTL18) | Chip select | RANK_EN0_N | |
| 74 CAS# | input (SSTL18) | Command input | DIMM_ADDR1/ODT1 | 194 VDDQ | supply | DQ power supply | | |
| 75 VDDQ | supply | DQ power supply | | 195 ODT0 | input (SSTL18) | On-die terminal | ADDR_HIGH | |
| 76 S1# | input (SSTL18) | Chip select | RANK_EN1_N | 196 A13 | input (SSTL18) | Address input | A13/WOE_N | |
| 77 ODT1 | input (SSTL18) | On-die terminal | NC | 197 VDD | supply | Power supply | | |
| 78 VDDQ | supply | DQ power supply | | 198 VSS | supply | Ground | VSS | |
| 79 VSS | supply | Ground | VSS | 199 DQ36 | I/O (SSTL18) | Data I/O | DQ36 | |
| 80 DQ32 | I/O (SSTL18) | Data I/O | DQ32 | 200 DQ37 | I/O (SSTL18) | Data I/O | DQ37 | |
| 81 DQ33 | I/O (SSTL18) | Data I/O | DQ33 | 201 VSS | supply | Ground | VSS | |
| 82 VSS | supply | Ground | VSS | 202 DQS13 | I/O (SSTL18) | Data strobe | RY/BY_N_R1D0 | |
| 83 DQS4# | I/O (SSTL18) | Data strobe | CLK_RET_N_D0 | 203 DQS13# | I/O (SSTL18) | Data strobe | NC | |
| 84 DQS4 | I/O (SSTL18) | Data strobe | CLK_RET_P_D0 | 204 VSS | supply | Ground | VSS | |
| 85 VSS | supply | Ground | VSS | 205 DQ38 | I/O (SSTL18) | Data I/O | DQ38 | |
| 86 DQ34 | I/O (SSTL18) | Data I/O | DQ34 | 206 DQ39 | I/O (SSTL18) | Data I/O | DQ39 | |
| 87 DQ35 | I/O (SSTL18) | Data I/O | DQ35 | 207 VSS | supply | Ground | VSS | |
| 88 VSS | supply | Ground | VSS | 208 DQ44 | I/O (SSTL18) | Data I/O | DQ44 | |
| 89 DQ40 | I/O (SSTL18) | Data I/O | DQ40 | 209 DQ45 | I/O (SSTL18) | Data I/O | DQ45 | |
| 90 DQ41 | I/O (SSTL18) | Data I/O | DQ41 | 210 VSS | supply | Ground | VSS | |
| 91 VSS | supply | Ground | VSS | 211 DQS14 | I/O (SSTL18) | Data strobe | RY/BY_N_R1D1 | |
| 92 DQS5# | I/O (SSTL18) | Data strobe | CLK_RET_N_D1 | 212 DQS14# | I/O (SSTL18) | Data strobe | NC | |
| 93 DQS5 | I/O (SSTL18) | Data strobe | CLK_RET_P_D1 | 213 VSS | supply | Ground | VSS | |
| 94 VSS | supply | Ground | VSS | 214 DQ46 | I/O (SSTL18) | Data I/O | DQ46 | |
| 95 DQ42 | I/O (SSTL18) | Data I/O | DQ42 | 215 DQ47 | I/O (SSTL18) | Data I/O | DQ47 | |

FIG. 14-5

| 96 | DQ43 | I/O (SSTL18) | Data I/O | DQ43 | 216 | VSS | supply | Ground | VSS |
|---|---|---|---|---|---|---|---|---|---|
| 97 | VSS | supply | Ground | VSS | 217 | DQ52 | I/O (SSTL18) | Data I/O | DQ52 |
| 98 | DQ48 | I/O (SSTL18) | Data I/O | DQ48 | 218 | DQ53 | I/O (SSTL18) | Data I/O | DQ53 |
| 99 | DQ49 | I/O (SSTL18) | Data I/O | DQ49 | 219 | VSS | supply | Ground | VSS |
| 100 | VSS | supply | Ground | VSS | 220 | RFU | | Reserved | NC |
| 101 | SA2 | input | Presence-detect | | 221 | RFU | | Reserved | NC |
| 102 | NC | | | NC | 222 | VSS | supply | Ground | VSS |
| 103 | VSS | supply | Ground | VSS | 223 | DQS15 | I/O (SSTL18) | Data strobe | RY/BY_N_R1D2 |
| 104 | DQS6# | I/O (SSTL18) | Data strobe | NC (GWY_VSEL0) | 224 | DQS15# | I/O (SSTL18) | Data strobe | NC |
| 105 | DQS6 | I/O (SSTL18) | Data strobe | NC (GWY_VSEL1) | 225 | VSS | supply | Ground | VSS |
| 106 | VSS | supply | Ground | VSS | 226 | DQ54 | I/O (SSTL18) | Data I/O | DQ54 |
| 107 | DQ50 | I/O (SSTL18) | Data I/O | DQ50 | 227 | DQ55 | I/O (SSTL18) | Data I/O | DQ55 |
| 108 | DQ51 | I/O (SSTL18) | Data I/O | DQ51 | 228 | VSS | supply | Ground | VSS |
| 109 | VSS | supply | Ground | VSS | 229 | DQ60 | I/O (SSTL18) | Data I/O | DQ60 |
| 110 | DQ56 | I/O (SSTL18) | Data I/O | DQ56 | 230 | DQ61 | I/O (SSTL18) | Data I/O | DQ61 |
| 111 | DQ57 | I/O (SSTL18) | Data I/O | DQ57 | 231 | VSS | supply | Ground | VSS |
| 112 | VSS | supply | Ground | VSS | 232 | DQS16 | I/O (SSTL18) | Data strobe | RY/BY_N_R1D3 |
| 113 | DQS7# | I/O (SSTL18) | Data strobe | NC (GWY_FHALFSPD) | 233 | DQS16# | I/O (SSTL18) | Data strobe | NC |
| 114 | DQS7 | I/O (SSTL18) | Data strobe | LNK_OVRD0 | 234 | VSS | supply | Ground | VSS |
| 115 | VSS | supply | Ground | VSS | 235 | DQ62 | I/O (SSTL18) | Data I/O | DQ62 |
| 116 | DQ58 | I/O (SSTL18) | Data I/O | DQ58 | 236 | DQ63 | I/O (SSTL18) | Data I/O | DQ63 |
| 117 | DQ59 | I/O (SSTL18) | Data I/O | DQ59 | 237 | VSS | supply | Ground | VSS |
| 118 | VSS | supply | Ground | VSS | 238 | VDDSPD | supply | Serial EEPRO | NC |
| 119 | SDA | I/O | Serial presence | NC | 239 | SA0 | input | Presence-detect | NC |
| 120 | SCL | input | Serial clock for | NC | 240 | SA1 | input | Presence-detect | NC |

METHODS OF COMMUNICATING TO DIFFERENT TYPES OF MEMORY MODULES IN A MEMORY CHANNEL

CROSS REFERENCE TO RELATED APPLICATIONS

This patent application is a divisional and claims the benefit of U.S. patent application Ser. No. 11/864,823 filed on Sep. 28, 2007 by inventors Kenneth A. Okin et al. entitled METHODS OF COMMUNICATING TO MEMORY MODULES IN A MEMORY CHANNEL, pending. U.S. patent application Ser. No. 11/864,823 claims the benefit of U.S. Provisional Patent Application No. 60/956,681 entitled PROGRAMMABLE MEMORY CONTROL FOR HETEROGENEOUS MAIN MEMORY filed on Aug. 17, 2007 by Kenneth Alan Okin et al.; and further claims the benefit of U.S. Provisional Patent Application No. 60/827,421 entitled SUBSTITUTION OF A PROCESSOR WITH A BUILT IN DRAM MEMORY CONTROLLER BY A NON-DRAM MEMORY CONTROLLER TO CONTROL ACCESS TO NON-DRAM TYPE MEMORY MODULES filed on Sep. 28, 2006 by inventors Kumar Ganapathy et al.; and U.S. Provisional Patent Application No. 60/862,597 entitled EXPANSION OF MAIN MEMORY IN A MULTI-PROCESSOR SYSTEM WITH A NON-DRAM MEMORY CONTROLLER TO CONTROL ACCESS TO NON-DRAM TYPE MEMORY filed on Oct. 23, 2006 by inventors Kumar Ganapathy et al.

FIELD

This application generally relates to memory controllers for controlling access to memory modules in main memory.

BACKGROUND

A computing system may have a homogeneous main memory with one type of memory, such as dynamic random access memory (DRAM) integrated circuits (ICs).

DRAM ICs retain data information by storing a certain amount of charge on a capacitor in each memory cell to store a logical one or alternatively, a logical zero. Over time, and because of read operations, the stored charge on the capacitor dissipates, in a process often referred to as leaking off. To preserve the stored charge on a DRAM capacitor, and thus maintain the ability of the DRAM to hold its memory contents, the stored charge in the memory cell may be increased through refresh cycles, which sometimes are performed periodically. A refresh cycle consumes power.

BRIEF DESCRIPTIONS OF THE DRAWINGS

FIG. 4A is a functional block diagram of a non-DRAM type of memory module.

FIGS. 11A-11C are tables to illustrate reassigning the wire interconnect of a memory channel on the fly in response to the type of memory module being accessed.

FIG. 14 (FIG. 14-1 through 14-5) is a table of a sample pin configuration re-mapping of a memory channel to access an exemplary non-volatile memory module.

DETAILED DESCRIPTION

In the following detailed description, numerous examples of specific implementations are set forth. However, implementations may include configurations that include less than all of the alternatives for the detailed features and combinations set forth in these examples.

Introduction

In some implementations, a programmable memory controller is provided to control access to different types of memory modules in a main memory. Non-volatile memory modules and DRAM memory modules may be used in the same memory channel that implements the same memory channel specification to form a heterogeneous main memory. In some implementations, the programmable memory controller may be contained in a commercially available processor or have the pin out of a commercially available processor so it may reside in the processor socket of a system. For example, the programmable memory controller may have a pinout of a processor and be plugged into a pre-existing motherboard with a socket that can receive the processor.

Newer memory modules may have greater density and different electrical characteristics. Previously to gain the benefit of newer memory module designs, a new computer or a new mother board was purchased to accept the new type of memory module, because the design of the memory controller was tightly coupled to the type of memory module being accessed. If new memory modules with different technology are used in the design of a new system, a new hardware design for a new memory controller is oftentimes generated. Designing a new hardware design for a new memory controller may increase the time to market a new system. Instead of designing a new memory controller from scratch, a programmable memory controller may be programmed to provide the functionality to control and access new memory module designs and speed up the time to market for new systems.

Computer Systems with Heterogeneous Memory Channels

Figure 1A:
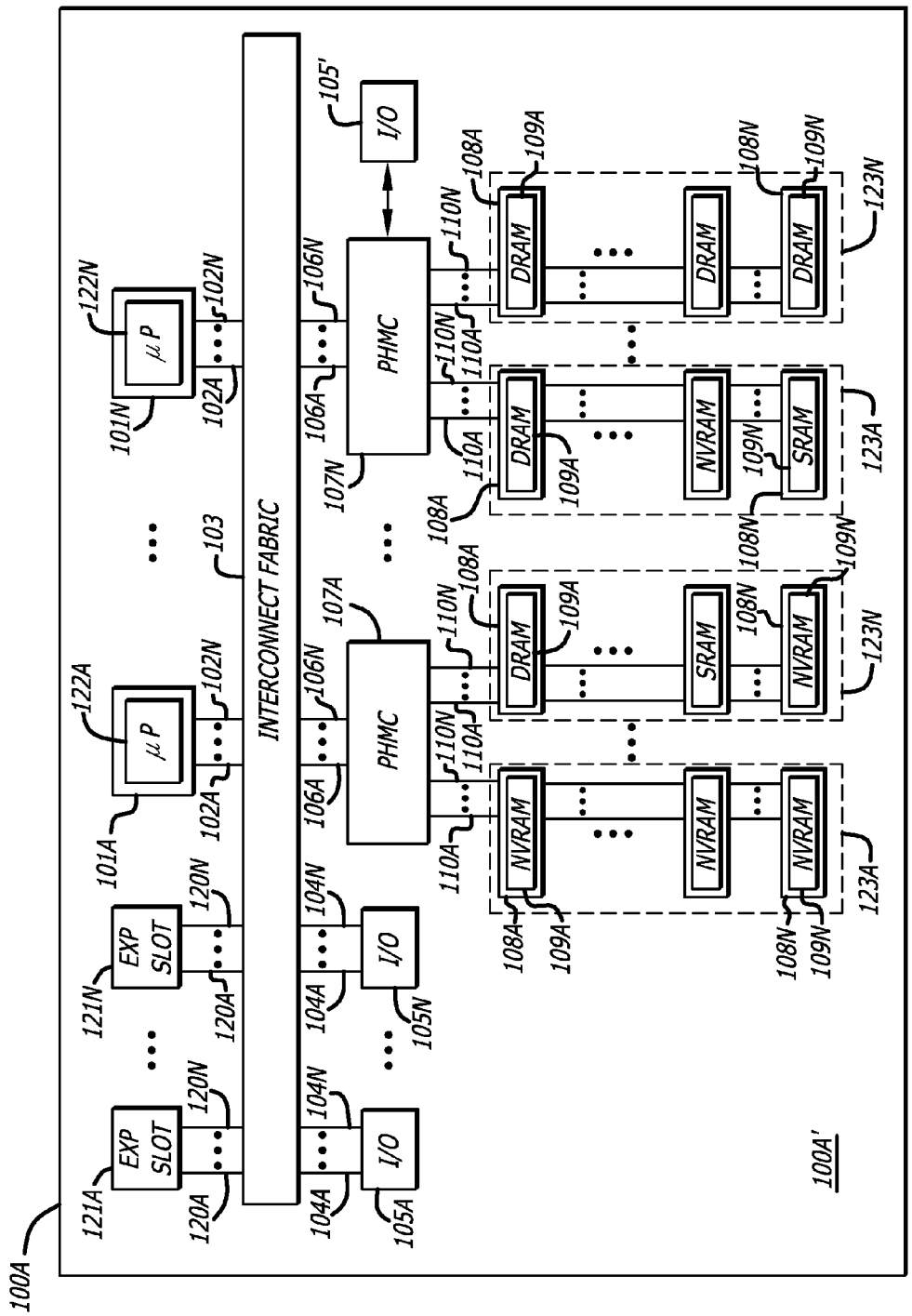
FIG. 1A is a functional block diagram of a computer system with a heterogeneous main memory with programmable heterogeneous memory controllers for control thereof.

Referring now to FIG. 1A, a functional block diagram of a computer system 100A with a heterogeneous main memory is illustrated. The computer system 100A includes a multiprocessor mother-board 100A'. Mounted to the mother-board 100A' is a plurality of processor sockets 101A-101N. Processors 122A-122N may be inserted into these processor sockets. The processor sockets 101A-101N are connected to the interconnect fabric 103 via traces 102A-102N. The interconnect fabric 103 may consist of just traces or it may contain other integrated circuits, but its function is to connect the various processors, memory, and I/O together within the mother-board 100A'. Portions of the interconnect fabric logic may be embedded within the processors and memory controllers.

Additionally mounted to the mother-board 100A' are one or more programmable heterogeneous memory controllers 107A-107N coupled to the interconnect fabric 103 via traces 106A-106N. The programmable heterogeneous memory controllers 107A-107N respectively control each of the memory channels 123A-123N. Printed circuit board traces 110A-110N in each of the memory channels 123A-123N are coupled between the memory module sockets 108A-108N and the programmable heterogeneous memory controllers 107A-107N. The memory module sockets may have proprietary pinouts or may be any one of the standard JEDEC pinouts (e.g., DDR2, DDR3, or other memory specification).

A plurality of different types of memory modules 109A-109N are plugged into the sockets 108A-108N of the heterogeneous memory channels. A heterogeneous memory channel is a memory channel in which mixed types or different types of memory modules may couple to the same memory channel bus. A homogeneous memory channel is a memory channel in which the same type of memory module (e.g., memory type (e.g., DDR2 DRAM etc)), but perhaps with different memory capacity, may couple to the same memory channel bus. The different types of memory modules in a heterogeneous memory channel may be dynamic random access memory dual-inline-memory modules (DRAM DIMMs) and non-volatile random access memory dual-inline-memory modules (NVRAM DIMM)s, for example. In some implementations of the memory modules, the different types of memory modules are designed to meet some or all of the DDR2 memory module specification (or DDR3 or other memory specification). In other implementations of memory modules, new memory modules meet the DDR2 specification (or DDR3 or other memory specification) and reassigning existing motherboard interconnects to contain different control signals to interface between the memory controller and the new memory modules. The programmable heterogeneous memory controller supports the use of different control signaling for various purposes. For example, the new control signals to the new memory modules might increase memory capacity or signal additional device status information over the pre-existing memory channel traces.

The programmable heterogeneous memory controller arbitrates and controls access to the memory channel bus by the different types of memory modules. The programmable memory controller can also arbitrate and control access to internal on-DIMM data busses connecting integrated circuits within certain memory modules via additional control signaling. For example, non-volatile memory integrated circuits stacked up behind support chips may have their access to both the internal on-DIMM bus and the memory channel bus arbitrated and controlled by the programmable heterogeneous memory controller. The programmable heterogeneous memory controller may control bus multiplexers in each of the DIMM support chips via extra control signals to allow access to the memory channel bus by selected non-volatile memory integrated circuits. In this manner, the non-volatile memory modules can have a greater memory capacity. Due to data skew and other timing considerations, typical main memory designs limit the number of DIMMS in a memory channel to a small number. The programmable heterogeneous memory controller allows extra control signaling so that the addressable memory capacity on a memory module and therefore within a memory channel can be increased substantially.

The programmable heterogeneous memory controller may act autonomously from a processor. For example, the programmable heterogeneous memory controller may make all the memory coupled into the memory module sockets visible to the processors in the system or it may use some of the memory attached as a cache to improve the total performance of the memory system. In this case, faster types of memory modules may be selected by the memory controller to act as a level of cache memory. Additionally, the programmable heterogeneous memory controller may re-interpret address and read/write commands from a processor as it sees fit. This allows for example, the programmable heterogeneous memory controller to read from an address space encompassing a memory module while a write or erase operation is concurrently occurring within the same module.

Additionally mounted to the mother-board 100A are one or more I/O subsystems 105A-105N that are connected to the interconnect fabric 103 via traces 104A-104N. Alternatively or conjunctively, one or more I/O subsystems 105' may be mounted to the mother-board 100A and coupled to the programmable heterogeneous memory controllers 107A-107N (or a system controller) to provide access to I/O devices by the processors.

In FIG. 1A, the memory controllers 107A-107N are directly coupled to the sockets 108A-108N in each memory channel 123A-123N by means of the PCB traces 110A-110N. However, memory controllers may also indirectly couple to the sockets 108A-108N in each memory channel through secondary memory controllers.

Figure 2:
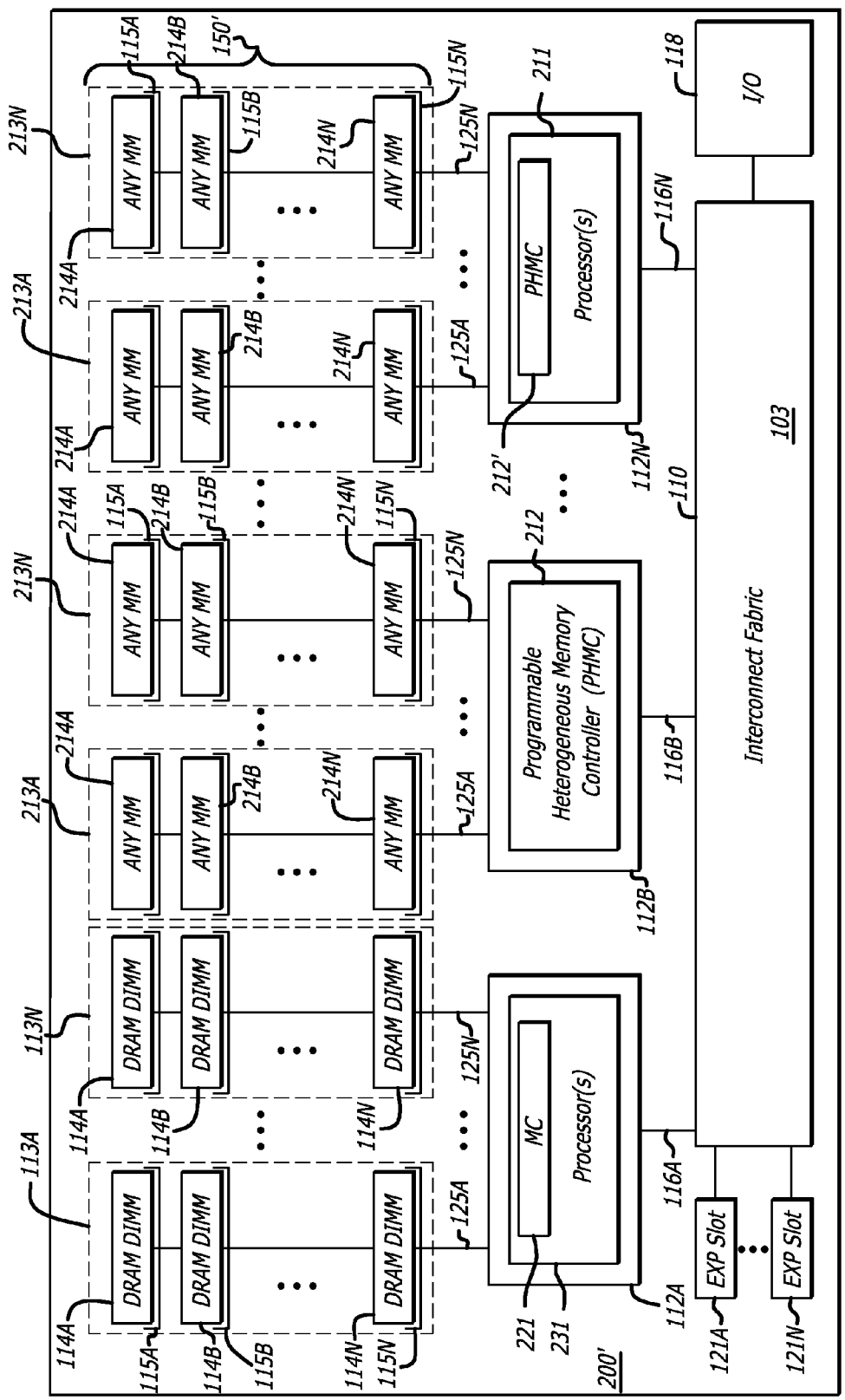
FIG. 2 is a functional block diagram of another computer system with a heterogeneous main memory with programmable heterogeneous memory controllers plugged into processor sockets or included as part of the processor to control the heterogeneous main memory.

Referring now to FIG. 2, an alternate multiprocessor system 200 and mother-board 200' is illustrated. In FIG. 2, the programmable heterogeneous memory controller may be an external programmable heterogeneous memory controller 212 to plug into a socket or it may be an integrated programmable heterogeneous memory controller 212' co-packaged in the processor package as part of a processor 211. The processor 211 includes the integrated programmable heterogeneous memory controller 212'. That is, the processor package 211 contains both the processor element and the integrated programmable heterogeneous memory controller 212'. There may be one or more programmable heterogeneous memory controllers within one processor package.

The external programmable heterogeneous memory controller 212 may be plugged into a processor socket 112B. Plugging the external programmable heterogeneous memory controller 212 into an open processor socket allows expansion and may upgrade a pre-existing memory channel to support a heterogeneous main memory with different types of memory modules.

In the multiprocessor system 200, processor sockets 112A-112N are connected to the interconnect fabric 103 via the traces 116A-116N of the motherboard 200'. The processor sockets 112A-112N are also connected to the memory channels 113A-113N and 213A-213N via traces 125A-125N. Memory channels 113A-113N are homogeneous memory channels to control access to DRAM memory modules 114A-114N that are plugged into the sockets 115A-115N. Memory channels 213A-213N are heterogeneous memory channels to control access to different or mixed types of memory modules 214A-214N within each channel, such as DRAM memory modules and non-volatile memory modules that may be plugged into the sockets 115A-115N.

In FIG. 2, the main memory 150' may include homogeneous memory channels 113A-113N and heterogeneous memory channels 213A-213N that can be controlled by the heterogeneous memory controller 212,212'. Alternatively, a homogeneous memory controller 221 may be used to control access to homogeneous memory channels 113A-113N in the main memory. The homogeneous memory controller 221 may be co-packaged with a processor 231 and plugged into a socket 112A.

One or more expansion connectors may also be used to upgrade the systems 100A, 200 so that more memory capacity is available and/or reduce the power consumption in the main memory of the computer system.

In some implementations, the one or more expansion connectors or slots 121A-121N may be used to upgrade and expand the main memory of the mother-board 100A',200'. A daughter card or expansion board (not shown) may be used to upgrade the main memory in the computer systems. The daughter card or expansion board would then include a programmable heterogeneous memory controller to control access to mixed or different types of memory modules in each channel. In this alternative manner, the main memory in the computer system may be expanded to be a heterogeneous main memory with different types of memory integrated circuits therein.

In FIG. 2, the external programmable heterogeneous memory controller 212, the processor 211 with the internal programmable heterogeneous memory controller 212', and the memory modules are plugged into sockets in order to couple to the mother board of the system. The programmable heterogeneous memory controller (PHMC) and the memory modules (MM) may be coupled to the mother boards of systems in other ways.

Figure 3:
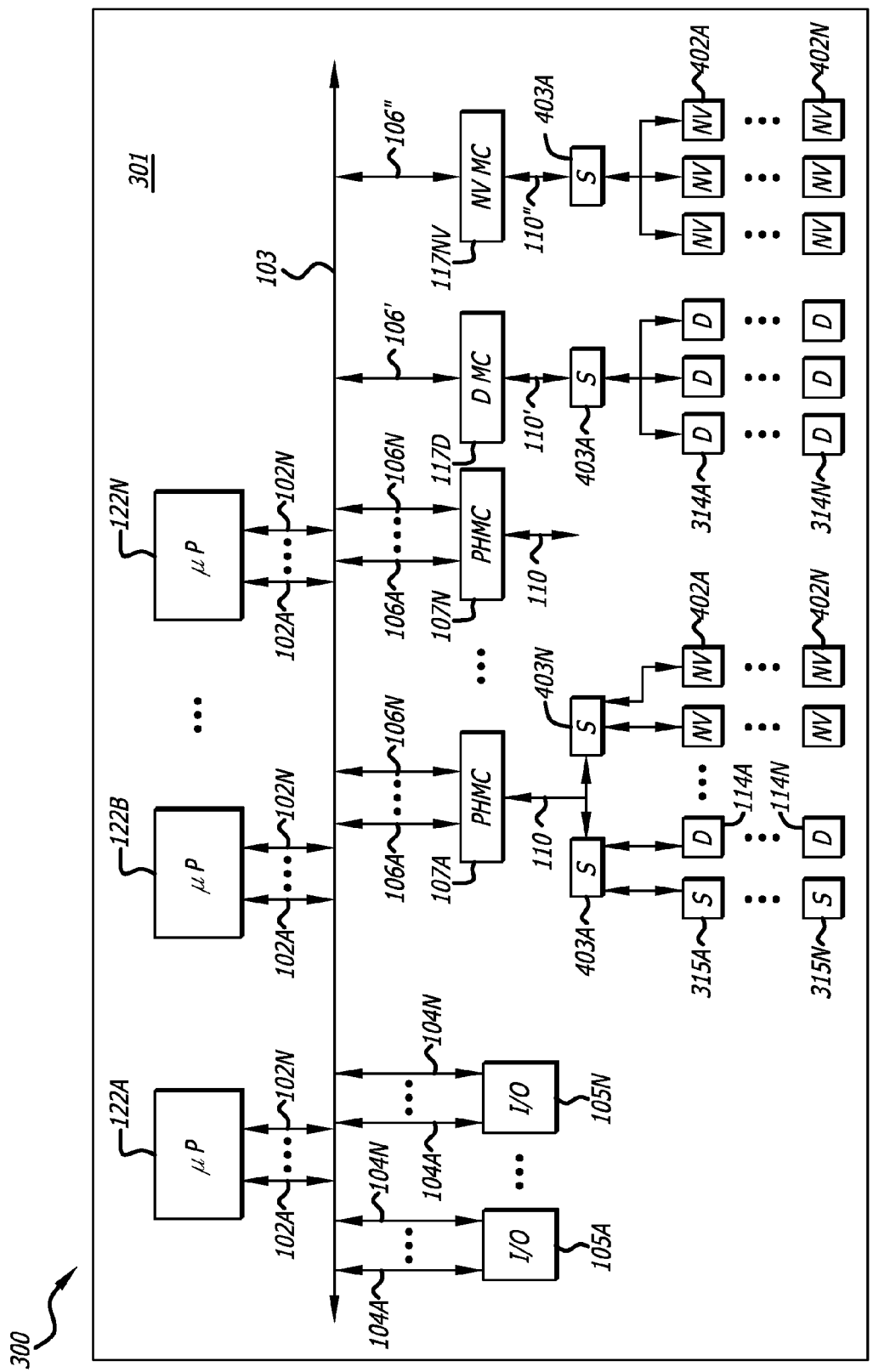
FIG. 3 is a functional block diagram of another computer system with a heterogeneous main memory with memory circuits and memory controller circuits, including programmable heterogeneous memory controllers, coupled to a motherboard.

Referring now to FIG. 3, the memory controllers and the memory modules are coupled to the mother board 301 of a computer system 300 without a socket, such as by soldering chips directly thereto. The computer system 300 includes a mother board 301 with processors 122A-122N, memory controllers (programmable heterogeneous memory controllers 107A-107N, DRAM memory controller 117D, non-volatile memory controller 117NV), support chips 403A-403N, dynamic random access memory (DRAM) integrated circuits 314A-314N, static random access memory (SRAM) integrated circuits 315A-315N, and non-volatile memory integrated circuits 402A-402N directly coupled thereto without a socket, such as by soldering.

The processors 122A-122N and the memory controllers (programmable heterogeneous memory controllers 107A-107N, DRAM memory controller 117D, non-volatile memory controller 117NV) are coupled to the interconnect fabric 103 to communicate with each other. Alternatively, one or more of the memory controllers may be integrated into the processors as shown in FIG. 2 to communicate with each other. Input/output chips 105A-105N may also be soldered to the motherboard and coupled to the interconnect fabric 103.

The programmable heterogeneous memory controllers 107A-107N are coupled to the memory channel bus 110 to communicate with the different types of memory chips (SRAM 315A-315N, DRAM 114A-114N, NVRAM 402A-402N) in the heterogeneous memory channel. The DRAM memory controller (DMC) 117D is coupled to the memory channel bus 110' to communicate with the DRAM types of memory chips 314A-314N in the homogeneous memory channel. The non-volatile random access memory controller (NVMC) 117NV is coupled to the memory channel bus 110" to communicate with the NVRAM type of memory chips 402A-402N in a homogeneous memory channel. One or more support chips 403A-403N may be coupled between the respective memory chips and the respective memory channel bus 110,110',110" to provide load isolation. The support chips may also be referred to as bridge chips herein.

Memory Modules

Referring now to FIG. 4A, a diagram of a non-DRAM type of memory module 214 (e.g., non-volatile memory module) is illustrated. The non-DRAM type of memory module 214 may be plugged into the memory module sockets 108A-108N, 115A-115N in the one or more heterogeneous memory channels 123A-123N, 213A-213N of the systems 100A, 200 illustrated in FIGS. 1A and 2, respectively.

A given memory module may have different memory types (SRAM, DRAM, or NON-VOLATILE MEMORY) and logic or other circuitry on its printed circuit board. Alternatively, a given memory module may have a homogeneous type of memory and may contain logic or other types of circuitry.

In some implementations, the non-DRAM type of memory module 214 is a non-volatile type of memory module. The non-volatile type of memory module may include at least one NOR-gate flash electrically erasable programmable read only memory (EEPROM) integrated circuit in accordance with some implementations. In one configuration, read and write accesses to a non-volatile memory integrated circuit is asymmetric. In this case, a write to non-volatile memory integrated circuits takes more time than a read from the non-volatile memory integrated circuits. A memory erase operation in non-volatile memory integrated circuits also takes more time than a read access. Some types of non-volatile memory integrated circuits, such as NOR FLASH EEPROM integrated circuits, may be configured so that read access times may be reduced to levels sufficient for use in main memory where an address is presented and data returned. In one configuration to address the asymmetry between read and write performance, a data communication protocol for erasing and writing data into non-volatile memory modules may be used wherein instruction packets are written to the device and the device then commanded to program or erase larger amounts of data in non-volatile memory.

In FIG. 4A, the non-DRAM type of memory module 214 includes a printed circuit board (PCB) 400 having pads of edge connectors 401 (on each side for a DIMM) formed thereon, a plurality of non-DRAM memory chips 402A-402N, and a plurality of support chips 403A-403N. The printed circuit board (PCB) 400 has a low profile memory module form factor (e.g., 30 millimeters (mm) high or more and approximately 133 mm wide) to be plugged into sockets without taking up much space.

The memory module 214 further includes a plurality of printed circuit board traces (e.g., printed wires) 404A-404N and 406A-406L formed on the PCB 400 coupling between the non-DRAM memory chips 402A-402N and the support chips 403A-403N and between the support chips 403A-403N and the pads of the edge connectors 401. The printed circuit board traces (e.g., printed wires) 404A-404N form an internal memory module bus 404 where the non-DRAM memory chips 402A-402N may contend for access to the memory channel bus through the support chips 403A-403B. The printed circuit board traces (e.g., printed wires) 406A-406L, collectively referred to by reference number 406, couple to the memory channel bus by way of the pads of the edge connectors 401.

At least one of the plurality of support chips 403A-403N may include a memory module identification (MMID) 410 that may be stored therein to provided an identification of the type of memory module and information regarding the memory integrated circuits 402A-402N mounted on the PCB 400. A plurality of signal lines form a communication port 412 over which the memory module identification (MMID) 410 may be communicated from each memory module to the programmable heterogeneous memory controller 107,212,212'. The support chip with the memory module identification further includes an input/output port 411 coupled to the communication port 412 to transmit and receive information over the port 412. If only a few signal lines are available to use, the communication port 412 may be a serial communication port and the I/O port 411 a serial I/O port with bi-direction communication of information being made with serial data. The MMID 410 may be polled by the programmable heterogeneous memory controller during initialization to determine the different types of memory modules that may be plugged into each socket. The MMID 410 may be communicated by a standard mechanism defined by a JEDEC standard or through some other mechanism.

In some implementations, the memory module 214 is a dual in-line memory module (DIMM) and the printed circuit board (PCB) 400 is a DIMM PCB with integrated circuits and pads of edge connectors on both front and back sides. The DIMMs may contain memory which does not have a deterministic access time. The DIMMs may thus signal the programmable heterogeneous memory controller that they either have data available for consumption or are ready to accept data. If a particular DIMM socket has a pinout for a specific JEDEC standard type of DDR, DDR2 or DDR3 DIMM and a DIMM not of that type is inserted into that particular socket, the programmable heterogeneous memory controller can program itself to reuse the existing pins of that DIMM SOCKET in the appropriate manner to control the type of DIMM that is inserted into the socket.

In some implementations, the memory module 214 is a non-volatile memory module with the non-DRAM memory chips 402A-402N being non-volatile memory integrated circuit chips, such as NOR FLASH EEPROM integrated circuit chips. The non-volatile memory may be mapped into the same address space as the main memory and may look to the processor as being slightly slower main memory when read.

Non-volatile memory integrated circuit chips typically have an asymmetry between read accesses and write accesses. Read access time is typically far less than the write access time due to the nature in which a write operation occurs into a non-volatile memory cell. Additionally, read accesses can randomly read any location in some non-volatile memory integrated circuits. However, write accesses tend to be block or sector oriented, once again due to the nature in which a write operation occurs to the non-volatile memory cells within the non-volatile memory integrated circuit. Thus, some non-volatile memory integrated circuits may be considered to randomly read locations like a random access memory but write sectors like a hard disk drive. These longer delays make the program and erase accesses to the non-volatile memory module non-deterministic events. That is, one may not know beforehand how long it will take a write operation or an erase operation to be completed by a non-volatile memory module.

To try and alleviate some of the asymmetry with the write operations, each non-volatile memory integrated circuit 402A-402N may include a write buffer 425 into which a plurality of write operations are stored for writing into a sector of memory cells at the appropriate moment. The write buffer 425 may store one or more words of data before data is written into the non-volatile memory cells, and a data communication protocol may be used to instruct the non-volatile memory integrated circuit where to write the data.

The programmable heterogeneous memory controller may use one or more DRAM memory modules as cache memory for the non-volatile memory to improve system performance. In which case, the programmable heterogeneous memory controller may include a cache memory controller.

Additionally, the non-volatile memory cells may be organized into a plurality of banks 426A-426D of non-volatile memory cells. In each memory integrated circuit, each of the banks may be further organized into sectors of non-volatile memory cells providing a predetermined memory capacity. While one bank is to be written with a write access or write operation, the other banks are free to be read by a read access or read operation. An erase operation to erase sectors of memory in the non-volatile memory integrated circuits may similarly be performed on a sector in one bank while other banks are free to be read by a read access or read operation.

Each non-volatile memory integrated circuit 402A-402N may further include a status register 427 that may be polled by the memory controller to read the status of each bank, such as busy in a write mode or an erase mode. Additionally, the serial communication port 412 may be used to bi-directionally communicate information between the memory controller and the memory modules, such as status.

The one or more support chips 403A-403N coupled to the serial communication port may include a register 415 to store status information regarding the operation of the memory integrated circuits 402A-402N that may be polled (requested) and communicated to the memory controller through the communication port 412.

Figure 6A:
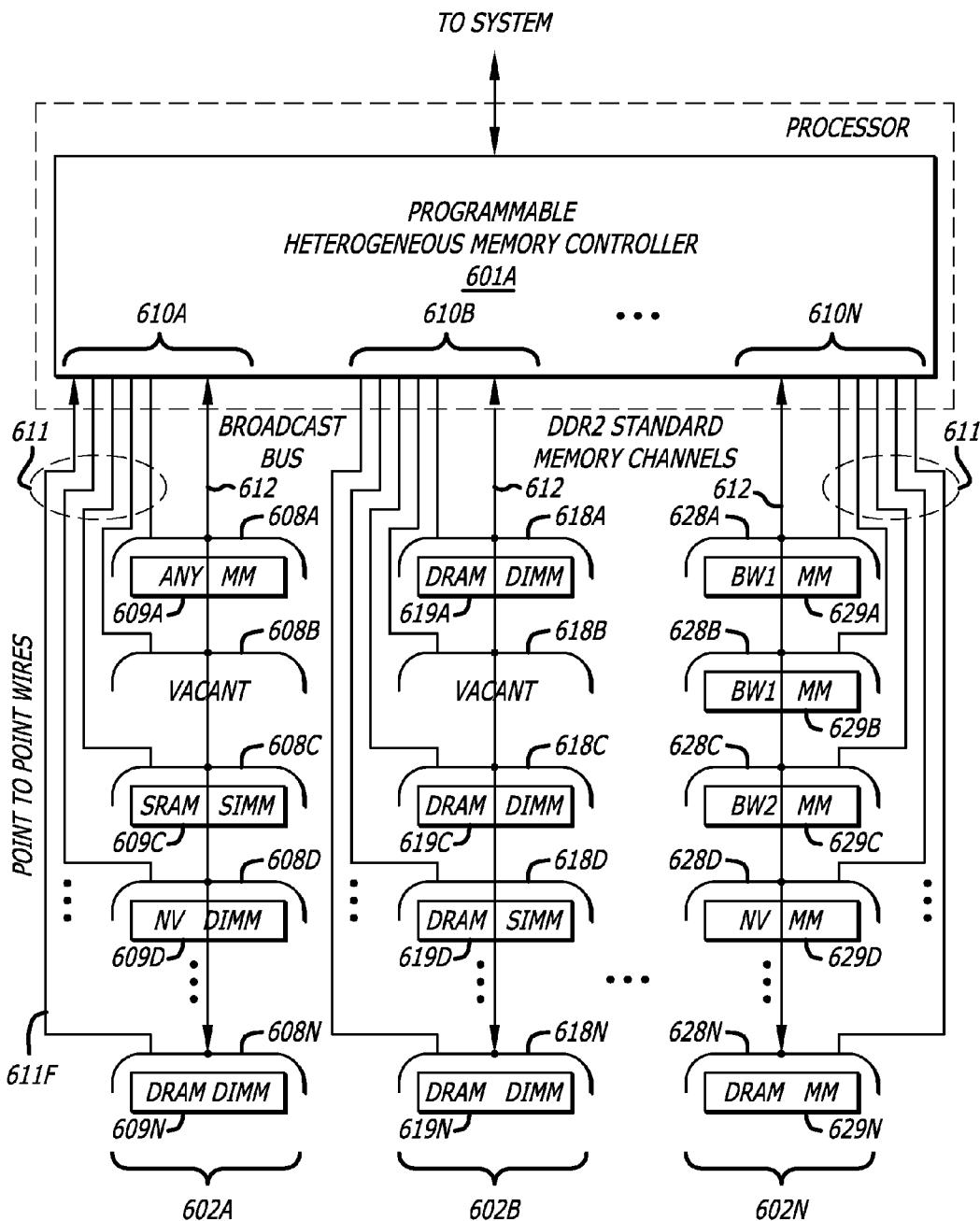
FIG. 6A is a block diagram of a plurality of standard memory channels with different types of memory modules coupled to a programmable heterogeneous memory controller.

Moreover, a feedback control signal, such as the status signal 611F in FIG. 6A, can be communicated from the non-volatile memory module to the memory controller to alleviate the non-deterministic nature of the write operations to the non-volatile memory modules. With the feedback control signal, the memory controller can avoid repeatedly polling the memory module to determine when an operation is completed by the memory module. One of the one or more support chips 403A-403N may receive status information from the memory integrated circuits 402A-402N and generate a status signal 611F that may be communicated to the memory controller over the memory channel bus.

Data strobe signals used to access DRAM memory modules may change to be feedback control signals that can be communicated from a non-volatile memory module to the memory controller to alleviate the non-deterministic nature of the erase and write operations in the non-volatile memory modules. For example in the sample implementation illustrated in FIG. 14 (FIG. 14-1 through 14-5), data strobe signals DQS13, DQS14, DQS15, DQS16 respectively change to status signals RY/BY_N_R1D0, RY/BY_N_R1D1, RY/BY_N_R1D2, RY/BY_N_R1D3 when a non-volatile memory module is being accessed within a memory module socket of a memory channel. The data strobe signals DQS13, DQS14, DQS15, DQS16 are used to clock data out each memory module in a DRAM memory channel. The RY/BY_N_R1D0, RY/BY_N_R1D1, RY/BY_N_R1D2, RY/BY_N_R1D3 signals are status signals for rank one memory of each of four DIMM modules/sockets that are in the memory channel. These status signals are fed back and coupled to the heterogeneous memory controller to more efficiently access the non-volatile memory module. Each status signal indicates whether or not a rank of memory in a memory module is busy or ready for another write or erase access to alleviate the non-deterministic nature of erase and write operations to non-volatile memory modules.

While non-volatile memory integrated circuits individually may be slower to access than DRAM, high data bandwidth may be achieved over the memory channel bus by accessing a plurality of non-volatile memory integrated circuits in parallel. The average power consumption of non-volatile memory integrated circuits is relatively low so that a greater number may be mounted onto a DIMM printed circuit board to achieve a greater memory capacity within the same power budget. The programmable heterogeneous memory controller allows access to the plurality of non-volatile memory integrated circuits in parallel over a memory channel bus in a manner that is transparent to a processor.

Note that the non-DRAM memory chips 402A-402N may also be some other kind of non-DRAM type of memory integrated circuit chips, such as static random access memory integrated circuits.

The plurality of support chips 403A-403N may be used to buffer addresses, and/or multiplex and de-multiplex data to and from the non-DRAM memory chips 402A-403N. The plurality of support chips 403A-403N may also be referred to herein as a plurality of buffer integrated circuits 403.

The support integrated circuit chips support (i.e., facilitate) read and write data accesses by the heterogeneous memory controller to the memory integrated circuits stacked up in different ranks and banks in the memory module. In some implementations, non-volatile memory integrated circuits are stacked up in a single multi chip package which is then attached to the non-volatile memory module.

Each of the support chips 403A-403N may include a many-to-one bus multiplexer 422 and a one-to-many bus demultiplexer 424. Alternatively, the many-to-one bus multiplexer 422 and the one-to-many bus demultiplexer 424 may be integrated together as a cross-bar switch instead.

The many-to-one bus multiplexer 422 is used to write data from some of the printed circuit board traces 404A-404N forming a plurality of busses coupled to the memory integrated circuits 402A-402N onto the memory channel bus over the printed circuit board traces 406A-406L. The many-to-one bus multiplexer 422 allows a large amount of data to be accessed in parallel, and then transferred to the memory controller in a burst of cycles. The one-to-many bus demultiplexer 424 may be used over a burst of cycles to receive data from the memory channel bus through the printed circuit board traces 406A-406L and then drive the data onto one of many data buses formed by printed circuit board traces 404A-404N coupled to the memory integrated circuits 402A-402N. A cross-bar switch may be similarly used to provide read and write access to the memory integrated circuits 402A-402N.

The memory channel bus may be limited as to the number of integrated circuits that may directly couple thereto, due to loading and timing considerations. The bus multiplexing provided by the plurality of support chips 403A-403N on the memory module allows extra memory to be stacked up behind the support chip on each side of the DIMM so that is has a greater memory capacity available than otherwise possible without the support chips. The use of the plurality of support chips 403A-403N avoids adding extra capacitive loading onto the memory channel bus from the extra memory integrated circuit chips in the memory module. The programmable heterogeneous memory controller may control one or more of the plurality of support chips and the bus multiplexing over the memory channel bus to access the memory stacked up behind the support chips.

Moreover if non-volatile memory modules are plugged into the sockets, a larger memory capacity may be had with less average power consumption. Even though extra memory integrated circuits are mounted in the memory module to increase memory capacity, the average power consumption may be lower if non-volatile memory integrated circuits are used in the memory modules.

Figure 4B:
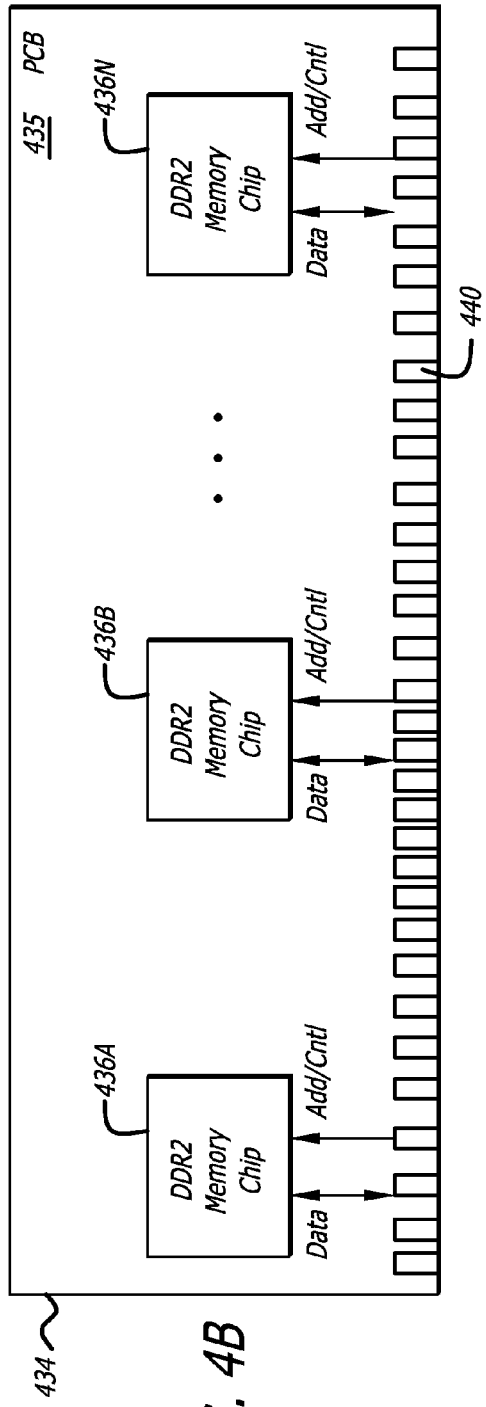
FIG. 4B is a functional block diagram of a DRAM type of memory module.

Reference is now made to FIG. 4B illustrating a JEDEC standard DRAM DIMM 434 for a DDR2 memory channel bus. The DRAM DIMM 434 includes a plurality of DRAM memory chips 436A-436N mounted to the printed circuit board 434 and directly coupled to the pads of the edge connector 440. Thus, the DRAM memory chips 436A-436N are more directly couple to the memory channel bus. The memory capacity of the DRAM DIMM 434 may be limited by the memory capacity provided by the DRAM memory chips 436A-436N directly coupled to the memory channel bus.

The DRAM memory chips 436A-436N are designed to adhere to the specification of the memory channel bus, such as the DDR2 specification (or DDR3 or other memory specification). Each memory chip 436A-436N has address/control and data lines directly coupled to the pads of the edge connector 440.

The DRAM DIMM 434 does not include any further support chips multiplexing data signals on and off the memory channel bus. The only multiplexing that may occur is internal to the memory chip itself and it is then multiplexing data bit columns of a memory array to the appropriate output pin of the memory chip. Without additional support chips providing additional multiplexing, the JEDEC standard ECC DRAM DIMM 434 may only have at most thirty-six individual memory chips. One rank of memory is typically located on the front side of the PCB 435 with memory chips directly coupled to the memory channel bus and another rank of memory is typically located on the back side of the PCB 435 with memory chips directly coupled to the memory channel bus. Limiting the number of ranks of memory to a predetermined number can limit the data bandwidth of the memory module and the memory channel.

For greater memory capacity, the memory module 214 illustrated in FIG. 4A may support up to 144 individual memory chips for example. Other non-volatile memory modules may be designed to support additional non-volatile memory integrated circuits.

In accordance with the teachings of U.S. provisional patent application 60/827,421 filed on Sep. 28, 2006 by inventors Kumar Ganapathy et al., incorporated here by reference, the main memory of the mother-board 100A of FIG. 1A may be upgraded to swap out one or more DRAM memory modules with non-volatile memory modules in a memory channel to reduce average power consumption in a computer system. In this case, non-volatile memory modules 214 are plugged into the one or more sockets 108A-108N replacing DRAM memory modules in the respective memory channel with the appropriate memory controller inserted into sockets 107A-107N.

In some implementations, each of the respective memory controllers 107A-107N of the memory channel is a programmable heterogeneous memory controller to control read and write access to the non-volatile memory modules 214 as well as other types of memory modules that may be plugged into the same memory channel. In some implementations, one or more processors in a multiprocessor system may be replaced with a processor package 211 having an integrated programmable heterogeneous memory controllers 212' to control read and write access to the non-volatile memory modules 214 in the respective memory channel.

Integrated Programmable Heterogeneous Memory Controller

Figure 5A:
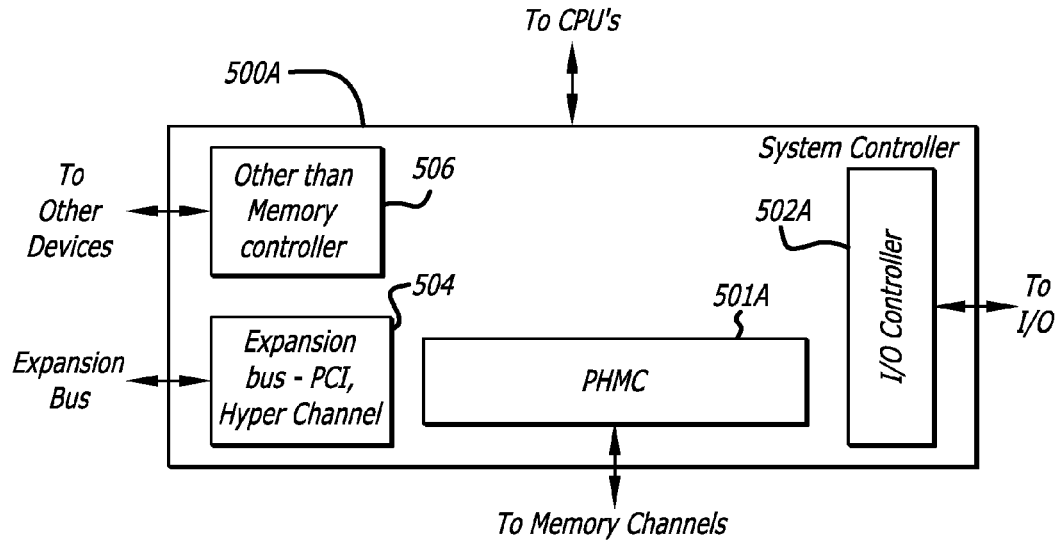
FIG. 5A is a functional block diagram of a system controller including a programmable heterogeneous memory controller.
Figure 5B:
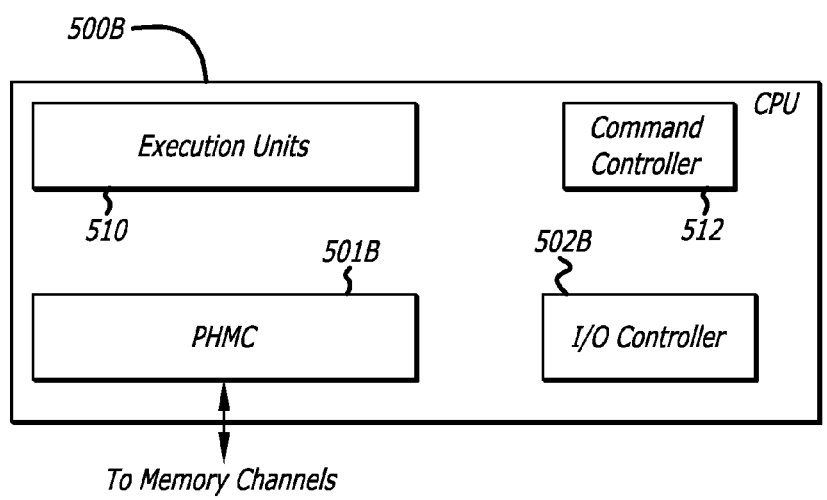
FIG. 5B is a functional block diagram of a processor or multiprocessor including a programmable heterogeneous memory controller.

Referring now to FIGS. 5A-5B, the programmable heterogeneous memory controller may be integrated into various chips to support memory channels with mixed types of memory modules.

In FIG. 5A, a functional block diagram of a system controller integrated circuit 500A is illustrated. The system controller integrated circuit 500A includes a programmable heterogeneous memory controller 501A, an input/output controller 502A, an expansion bus interface (e.g., PCI, hyperchannel) 504, and a device controller 506 to control access to devices other than memory. The programmable heterogeneous memory controller 501A controls access to mixed types of memory modules in the same memory channel.

In FIG. 5B, a functional block diagram of a central processing unit (CPU) or processor 500B with an integral or integrated memory controller is illustrated. The central processing unit (CPU) or processor 500B includes a programmable heterogeneous memory controller 501B, it may include an input/output controller 502B, a command controller 512, and one or more execution units (EU) 510. The programmable heterogeneous memory controller 501B may be integrated with the processor or merely co-packaged in the same package. The programmable heterogeneous memory controller 501B within the processor controls access to mixed types of memory modules in the same memory channel.

Programmable Heterogeneous Memory Controller

Figure 6B:
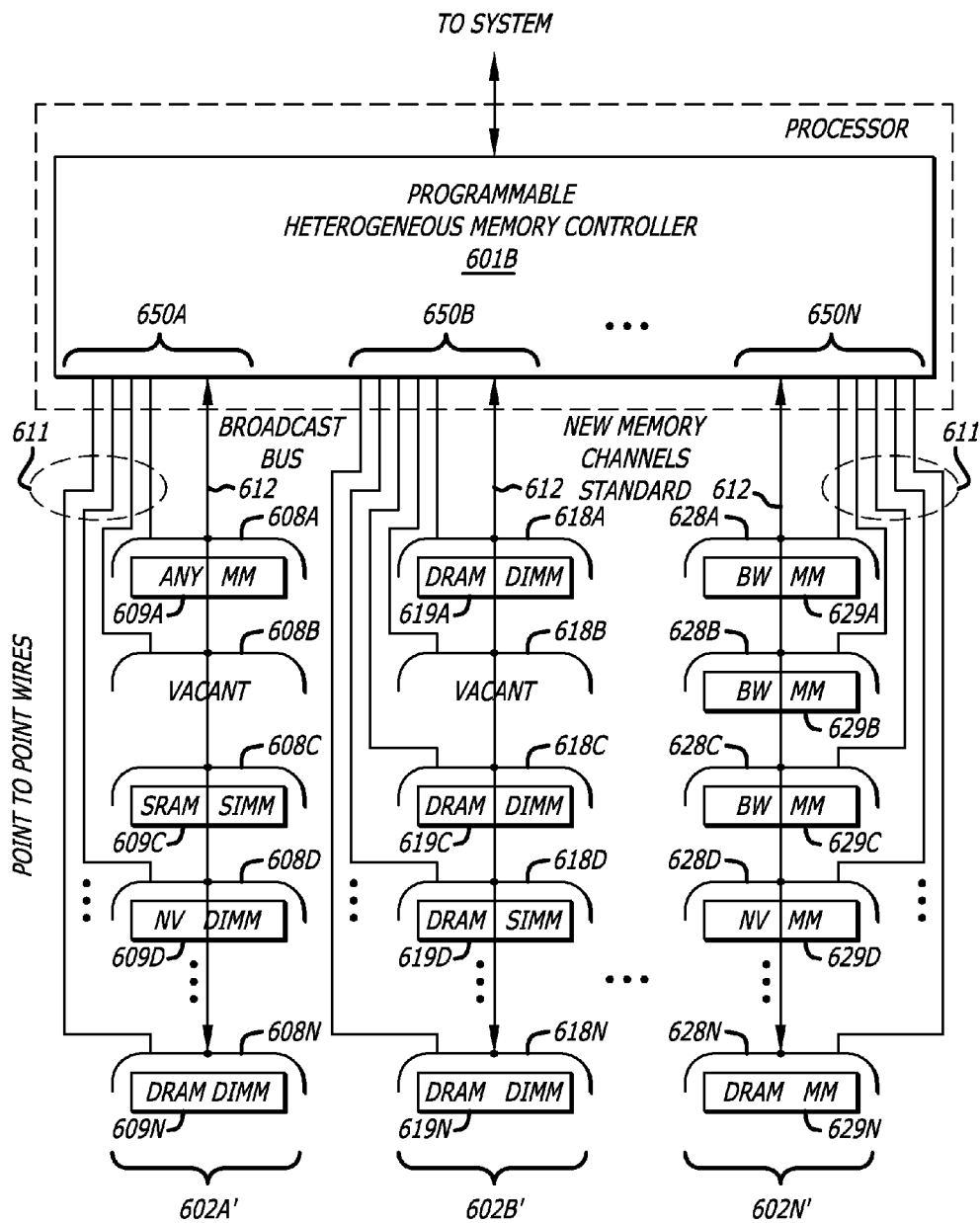
FIG. 6B is a block diagram of a plurality of newly specified memory channels coupled to a re-programmed programmable heterogeneous memory controller.

Referring now to FIGS. 6A-6B, the programmable heterogeneous memory controller 601A-601B is programmable to control access to memory modules within a memory channel. It may be programmed to support the different types of memory modules that may be plugged into the sockets of the same memory channel. That is, the types of memory modules plugged into the same memory channel may be mixed and the programmable heterogeneous memory controller may be programmed to communicate with each. For example, memory channel 602A may have any type of memory module 609A that supports the specification for memory channels (e.g., DDR2, DDR3, etc.) including a static random access memory module 609C, a non-volatile memory module 609D, or a DRAM memory module 609N. The programmable heterogeneous memory controller 601A may be programmed to communicate with each of these plurality of types of memory modules within the same memory channel. Provided that the memory module physically plugs into a memory socket 608A-608N, matches power connections or a subset thereof, and does not electrically invalidate the memory channel bus, it may be plugged into the same memory channel and accessed by the programmable heterogeneous memory controller 601A over the same memory channel bus as other modules. For example, memory modules with different data bandwidth's may be (e.g., BW1 memory module 629A and BW2 memory module 629C or non-volatile memory module 629D and DRAM memory module 629N) plugged into the same memory channel 602N and accessed by the memory controller 601A over the memory channel bus 610N.

A memory channel 602A-602N is a group of wires coupled to a memory controller forming a memory channel bus 610A-610N with two classes of wire interconnect, point to point wires and broadcast or bus wires, which is in turn coupled to sockets to communicate with memory modules plugged therein. Each memory channel 602A-602N is independent from each other.

Each memory channel bus 610A-610N further has a plurality of broadcast wires (PCB traces) 612 that are shared with each and every socket 608A-608N in the respective memory channel. That is, each of the wires making up the broadcast or bus wires 612 couple to each socket 608A-608N in the given memory channel and each memory module that is coupled thereto. Thus, signals that are written onto the broadcast wires 612 may be read by any one of the memory modules plugged into the memory sockets in the respective memory channel 602A-602N.

Each memory channel bus 610A-610N has a plurality of point to point wires 611 that couple from the memory controller 601A to each respective socket 608A-608N. The plurality of point to point wires (PCB traces) 611 from the memory controller are independent from socket to socket.

Generally in accordance with the JEDEC DDR2 specification there are four point to point wires for signals S0, S1, ODT0, and ODT1 in each memory channel. These point to point wires may be reassigned to another logical function. Additionally, there are approximately 29 address, clock and control output only signals from the memory controller to each and every socket/DIMM in each memory channel. Moreover, there are 72 bidirectional data lines and 36 bidirectional data strobe lines (1 data clock for four bits of data) between the memory controller and each and every socket/DIMM in each memory channel.

One of the point to point wires 611 may be redefined to be a status signal 611F generated by a memory module that is communicated to the memory controller. For example, the status signal 611F may be fed back to the programmable heterogeneous memory controller 601A to let it know that the memory module is ready for another access. The status signal 611F is particularly useful for accessing non-volatile memory modules as it may take some time to write or erase memory locations therein. With the status signal 611F, the memory controller does not need to repeatedly poll the memory module with this capability to determine its status and whether or not it is ready for another erase or write operation.

Figures 9, 10:
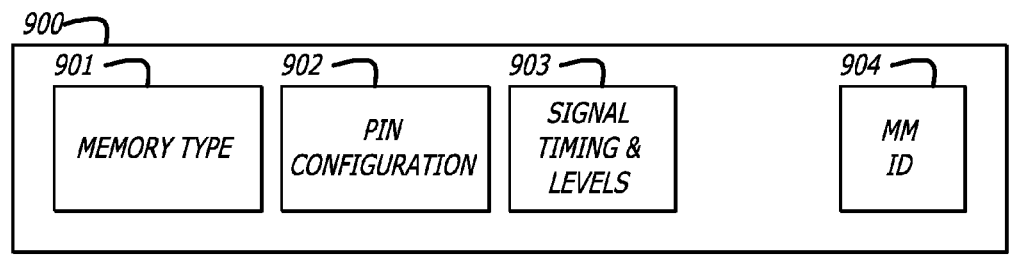
FIG. 9 is a functional block diagram of a memory module driver for each different type of memory module.
FIG. 10 is a table to illustrate information stored in a memory module socket register/table for each memory channel in a main memory.

With reference to FIGS. 6A-6B, and 9, the heterogeneous memory controller 601A-601B may be programmed by software, such as a memory module (MM) software driver 900. The memory module software driver 900 may read the memory module identification (ID) 904, then load data into the heterogeneous memory controller; such data might include the memory type 901 (e.g., SRAM, DRAM, or NVRAM); pin configuration 902; signal timing and logic levels 903 (e.g., active low or active high).

A memory module can be matched to its memory module software driver through the memory module ID. That is, the memory module ID 410 read from the memory module should match the memory module identification (ID) 904 of the software driver 900. The memory module identification (ID) 410 may be encoded to indicate information regarding its source of manufacturer as well as the type of memory, its capacity, and speed. Moreover if a memory module software driver 900 for a given memory module ID is not readily available within the programmable heterogeneous memory controller 601A-601B, it may be downloaded over a network such as the internet or loaded from a disk, similar to how new printer drivers may be loaded into a computer system.

With reference to FIG. 10, the programmable heterogeneous memory controller 601A may poll each socket in each memory channel upon initialization to determine what types of memory module are plugged into each socket in each memory channel. FIG. 10 illustrates an exemplary memory module socket table that may be stored in registers or a memory within the programmable heterogeneous memory controller 601A. The left most column indicates the socket number while the upper most row indicates the memory channel number. The entries into the table are representative of the memory module identification. For example, socket one (S1) in memory channel one (MC1) may have an SRAM1 type of memory module plugged in thereto. A socket may be empty or vacant. In which case, the table entry may be indicated as empty such as indicated for socket two (S2) in memory channel two (MC2) for example. The entries may be used to select the appropriate memory module driver to access each memory module in each respective memory channel.

Referring now to FIGS. 11A-11C, differing pin configurations 902 are illustrated in the tables below the lines making up the memory channel bus 610. The first row in each table indicates the pin number. The second row in each table represents whether the pin is an input only pin (I), an output only pin (O), a bidirectional (both input and output) pin (B), or a power pin (P) such as a ground pin or a power supply pin. The third row in each table represents the functionality assigned to each pin, such as power (V), ground (G), no connect (NC), data pin (Di), address pin (Ai), or control pin (Ci). These differing pin configurations may be stored for example as the pin configuration 902 (see FIG. 9) for different memory module drivers 900.

Mixed types of memory modules in a memory channel may cause the memory controller to change the pin configuration of a memory channel bus on the fly as each memory module is being accessed. For example, the pin configuration illustrated in FIG. 11A may be for accessing a first memory module over the memory channel bus 610. In FIG. 11A, pins numbering 3 and 4 respectively are control input pins C1 and C2, for example. When accessing a second memory module of the memory channel bus 610, the pin configuration may change to that illustrated in FIG. 11B, for example. In FIG. 11B, pins numbering 3 and 4 are respectively bi-directional data bus pins D1 and D2, for example. When accessing a third memory module of the memory channel bus 610, the pin configuration may change to that illustrated in FIG. 11C, for example. In FIG. 11C, pins numbering 3 and 4 are respectively address input pins A1 and A2, for example. The programmable heterogeneous memory controller 601A changes the signal functionality and pin assignment on the fly as each different memory module is accessed. If the same memory module is plugged into two memory sockets in the same memory channel, there may be no change in programming when the memory controller changes from accessing one to the other in succession.

Note that the wires for power (V) and ground (G) do not change when accessing differing memory modules over the same memory channel. For example, pins numbering 1 and 2 remain constant as power (V) and ground (G) respectively. However, not every memory module need connect to every power or ground pin. For example, in FIG. 11B, the memory module to be accessed with the pin configuration is a no-connect (NC) to pins N−1 and N, ground (G) and power (V), respectively.

To address additional memory and increase memory capacity of the main memory, the programmable heterogeneous memory controller in one configuration may use additional pins to form a larger address to address a larger memory space, in response to the type of memory module being accessed. In another configuration, the programmable heterogeneous memory controller may use pre-existing address pins over multiple address cycles to form a larger address to address a larger memory space in response to the type of memory module being accessed.

FIG. 14 (FIG. 14-1 through 14-5) illustrates an exemplary pin configuration map of a non-volatile memory module in accordance with some implementations. When the non-volatile memory module is accessed, the pin configuration of the memory channel changes from the signal name column associated with a DDR2 memory module specification to the signal assigned column for the non-volatile memory module.

For example, pins 73, 74 respectively change from WE#, CAS# to DIMM_ADDR0/ODT0,DIMM_ADDR1/ODT1 to identify which DIMM socket/DIMM memory module is being addressed after initialization and to setup the on-die termination during initialization.

As another example, pins 188, 183, 63, 182, 61, 60, 180, 58, 179, 177, 70, 57, 176, 196, 174, 173, 54 respectively change from signal address bits A0, A1, A2, A3, A4, A5, A6, A7, A8, A9, A10/AP, A11, A12, A13, A14, A15, A16/BA2 to multi-cycle address bits A0/A17/DSEL_0, A1/A18/

DSEL_1, A2/A19, A3/A20, A4/A21, A10/A27, A11/Reset_N, A12/OE_N, A13/WEO_N, CE2_N/A14, CE3_N/A15, CE1_N/A16 to address a larger memory space within each memory module. To indicate whether an address high byte or an address low byte is available on these multi-cycle address pins, pin 195 respectively changes from ODT0 to ADDR_HIGH. If ADDR_HIGH signal is a logically high signal, the address high byte (A17, A18, A19, etc.) is provided on the multi-cycle address bits. If ADDR_HIGH signal is a logically low signal, the address low byte (e.g., A0, A1, A2, etc) is provided on the multi-cycle address bits.

As another example, pins 193, 76 retain the same function. These signals select which rank of memory within a memory module is being accessed.

As yet another example, pins 125, 134, 146, 155 respectively change from data strobe signals DQS9, DQS10, DQS11, DQS12 to RY/BY_N_R0D0, RY/BY_N_R0D1, RY/BY_N_R0D2, RY/BY_N_R0D3 when the non-volatile memory module is to be accessed within a socket. The RY/BY_N_R0D0, RY/BY_N_R0D1, RY/BY_N_R0D2, RY/BY_N_R0D3 signals are status signals for rank zero memory of each of four DIMM modules/sockets in a memory channel. Pins 202, 211, 223, 232 respectively change from data strobe signals DQS13, DQS14, DQS15, DQS16 to RY/BY_N_R1D0, RY/BY_N_R1D1, RY/BY_N_R1D2, RY/BY_N_R1D3 when the non-volatile memory module is to be accessed within a socket. The RY/BY_N_R1D0, RY/BY_N_R1D1, RY/BY_N_R1D2, RY/BY_N_R1D3 signals are status signals for rank one memory of each of the four DIMM modules/sockets in the memory channel. These status signals are fed back and coupled to the heterogeneous memory controller to more efficiently access the non-volatile memory module. Each status signal indicates whether or not a rank of memory in a memory module is busy or ready for another write or erase operation to alleviate the non-deterministic nature of erase and write operations to the non-volatile memory module.

FIGS. 11A-11C have been described as changing the signal/pin configuration of the memory channel bus as each different memory module is accessed in each socket. However, the signal/pin configuration may also change due to a change in the specification of the memory channel bus for a new memory channel design.

In FIG. 6A, each of the memory channel buses 610A-610N may be designed to support the DDR2 memory module specification. However, a new computer system may be designed with a different memory module specification and a different pin/signal configuration for a memory channel. As the heterogeneous memory controller 601A is programmable, its design can be readily updated to the new memory module specification and the new pin/signal configuration of a new memory channel.

Consider FIG. 6B for example. A new memory communication channel specification standard may be established to define a new pin/signal configuration for each of the new memory channel busses 650A-650N in each respective memory channel 602A'-602N'. The memory modules may each be designed to mate with the new pin/signal configurations of the new memory channel busses 650A-650N. Provided that the total non-power pin count is equivalent, the programmable heterogeneous memory controller 601A may be readily updated by reprogramming to the programmable heterogeneous memory controller 601B illustrated in FIG. 6B. The memory module drivers for the new memory channel standard are rewritten to support the new memory channel busses 640A-650B and the new drivers are loaded into the programmable heterogeneous memory controller 601B. In this manner, the logic design of the programmable heterogeneous memory controller can remain the same, being updated with software by loading new memory module drivers, while the circuits underneath the logic may change to adapt to new power supply voltages. That is, the logical netlist of the programmable heterogeneous memory controllers 601A and 601B remain the same while the pin configuration is updated by new memory module driver software. With the programmable heterogeneous memory controller 601A being programmable in this manner, the time to develop new or proprietary memory channels can be substantially reduced. Thus, the programmable heterogeneous memory controller is reusable as an IP core block as it can be readily programmable to the type of memory channel, memory channel bus, and memory modules to which it will interface. Different processor manufactures can purchase the logical netlist of the programmable heterogeneous memory controller and program it to meet their specific memory channel requirements.

Figure 7A:
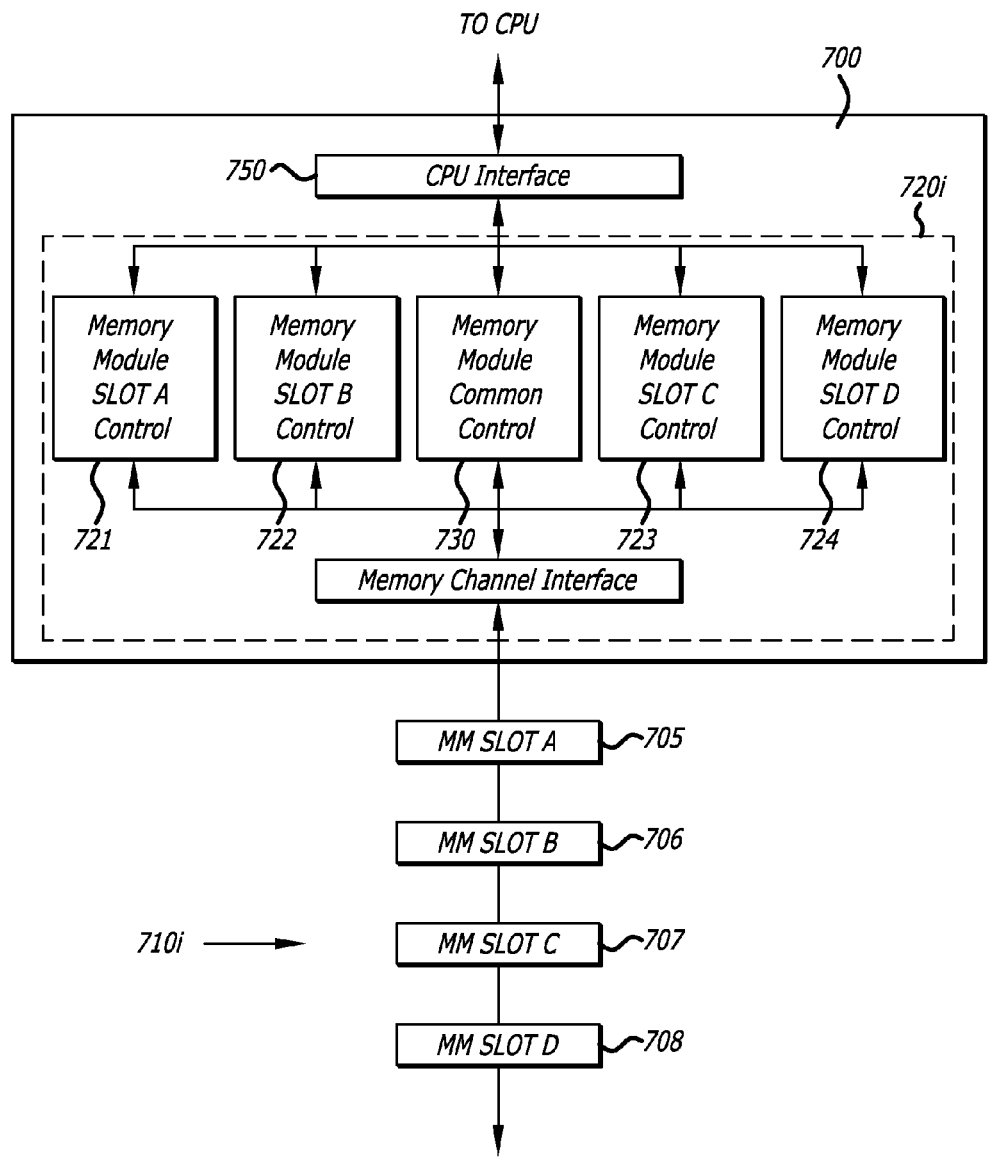
FIGS. 7A-7B are high-level functional block diagrams of an implementation of a programmable heterogeneous memory controller coupled to different types of memory modules in a memory channel.
Figure 7B:
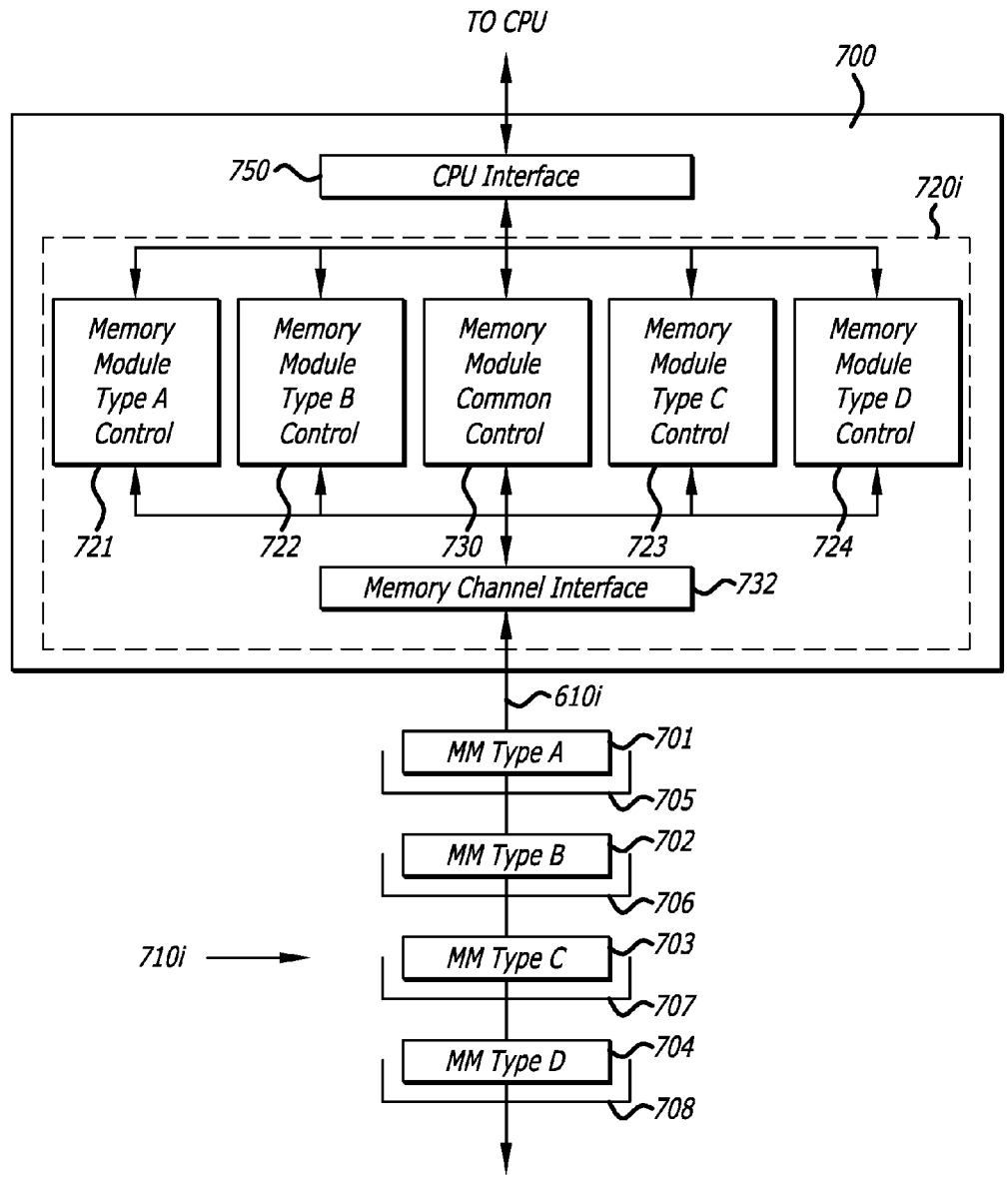

Referring now to FIGS. 7A-7B, a high-level functional block diagram of a programmable heterogeneous memory controller (PHMC) 700 is illustrated. In FIG. 7A, the programmable heterogeneous memory controller 710 has yet to be programmed as it is waiting for memory modules to be plugged into the sockets or slots 705-708. Each memory channel controller 720*i* includes a specific memory module slot controller 721-724 for each slot or socket 705-708. In FIG. 7B, two or more different types of memory modules (e.g., type A memory module 701, type B memory module 702, type C memory module 703, and type D memory module 704) are coupled into each memory channel 710*i*. Note that one or more of the memory modules plugged into the slots/sockets 705-708 may be the same type of memory module. In which case, two or more of the memory module slot controllers 721-724 may be programmed with the same program to handle the same types of DIMMs.

For each memory channel 710*i*, the programmable heterogeneous memory controller 710 includes a memory channel controller 720*i*. Each of the memory channel controllers 720*i* is coupled between a processor interface 750 and their respective memory channel 710*i*. Each memory channel controller 720*i* couples to the processor or interconnect fabric interface 750 to communicate with a processor or I/O controller for memory operation instructions and results thereof.

As shown inn FIG. 7B, each memory channel controller 720*i* may include a specific memory module slot controller 721-724 for each slot or socket 705-708 into which a memory module 701-704 may couple. Each memory channel controller 720*i* further includes a common memory module controller 730 coupled to a memory channel interface 732. Socket/Slot A memory module controller 721 is for controlling the type of memory module coupled into socket A 705 (e.g., type A memory module 701). Socket/slot B memory module controller 722 is for controlling the type of memory module coupled into socket B 706 (e.g., type B memory module 702). Socket/slot C memory module controller 723 is for controlling the type of memory module coupled into socket C 707 (e.g., type C memory module 703). Socket/slot D memory module controller 724 is for controlling the type of memory module coupled into socket D 708 (e.g., type D memory module 704). The specific memory module controllers 721-724 are for generating the different control signals for each different memory module that may be plugged into the available memory module sockets. The specific memory module controllers 721-724 are each programmable by a respective memory module software driver.

The common memory module controller 730 is for generating the common control signals amongst the different memory modules plugged into the available memory module sockets. The data pins and the address pins may remain the same between the different memory modules plugged into the available memory module sockets and may be under control of the common memory module controller 730.

The specific memory module controller 721-724 and the common memory module controller 730 for each memory channel 710*i* communicate to their respective memory modules through the memory channel interface 732. The memory channel interface 732 is flexible to allow for pin configuration changes in the memory channel bus 610*i* coupled to the memory modules and the respective sockets.

The memory channel bus 610*i* in each memory channel 710*i* includes a plurality of interconnect wires (PCB traces) which are shared or broadcast to all the memory modules and the respective sockets. The shared or broadcast signals to all the memory modules may be generated by the common memory module controller 730. The memory channel bus 610*i* in each memory channel 710*i* further includes a plurality of interconnect wires (PCB traces) which are independent and couple to only one of the memory modules and the respective sockets so that the signals are specific to that memory model. The specific signals for each individual memory model may be generated by the associated specific memory module controller 721-724. For example, specific signals for the type A memory module 701 and its socket 705 alone may be generated by the socket A memory module controller 721.

Figure 8A:
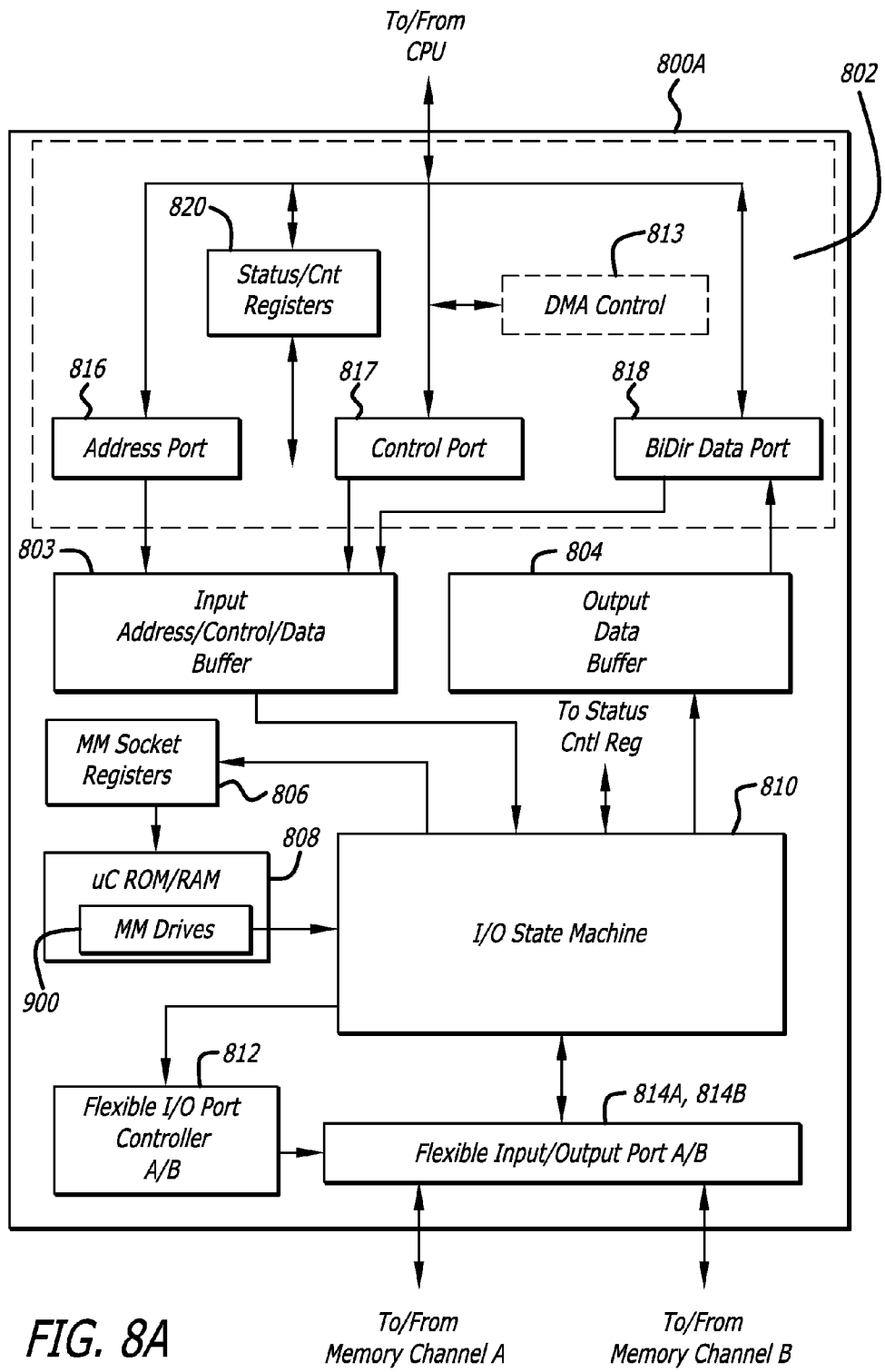
FIGS. 8A-8B are more detailed functional block diagrams of an implementation of a programmable heterogeneous memory controller.

Referring now to FIG. 8A, a more detailed functional block diagram of a programmable heterogeneous memory controller 800 is illustrated. Note that FIG. 8A illustrates an example of how a programmable heterogeneous memory controller may be functionally organized internally—it is possible to construct programmable heterogeneous memory controller with a different arrangement of functional blocks. The programmable heterogeneous memory controller 800 includes a processor or interconnect fabric (system) interface 802, an input buffer 803, an output buffer 804, memory module socket control registers 806, micro-coded memory 808 (random access memory (RAM) and/or read only memory (ROM)), one or more input/output state machines 810, a flexible Input/Output port controller, and a flexible memory channel interface 814 (also referred to as a flexible I/O port) coupled together as shown. A direct memory access controller 813 may optionally be provided such that is may transfer data between the memory in the heterogeneous memory controller and some other device in the system.

The processor (system) interface 802 generally allows controlled access to a main memory by a processor. The processor (system) interface 802 may include an address port 816 to receive addresses from a processor from which to access main memory, a control port 817 to receive control signals from the processor to access main memory, a bidirectional data port 818 to read data from a processor to write into memory and to write data out to the processor after being read from memory, and status/control registers 820 to allow the processor to read the status of the memory channels and control the access to the memory channels coupled to the memory controller.

The input buffer 803 is to buffer addresses, controls, and data that is received from the processor. The output buffer 804 is to buffer the data that is to be written out to the processor. The input buffer 803 and the output buffer 804 may be combined together as a larger single input/output buffer with more complicated control logic.

The memory module socket registers 806 are provided to store the memory module identification (ID) of each memory module plugged into each socket in each memory channel that is directly coupled to the memory controller 800A. The memory module socket registers may store the information of a memory module socket table illustrated in FIG. 10. With this information, the memory controller 800A knows what type of memory module it will directly communicate with in each socket.

The micro-coded memory 808 (random access memory (RAM) and/or read only memory (ROM)) is to store the memory module software drivers 900 for each different type of memory module indicated by the memory module socket registers 806. The memory module software drivers 900 may include the memory type 901 (e.g., SRAM, DRAM, or NVRAM); pin configuration 902; control signal timing and logic levels 903 (e.g., active low or active high); and the memory module identification (ID) 904. The information contained in each memory module software driver 900 is coupled to the one or more I/O state machines 810. That is, the micro-coded memory 808 supplies memory module software drivers to the I/O state machines.

The one or more I/O state machines 810 establish the appropriate pin configuration in the memory interface 814 and generate appropriate logic signals for the pins with the appropriate timing in response to the type of memory module being accessed in the given socket and its memory module software driver. The one or more I/O state machines 810 perform these functions each time a given memory module is accessed to perform a write operation, a read operation, or an erase operation. Functions of the one or more state machines are also described with reference to FIG. 12. The one or more I/O state machines 810 signal the flexible I/O port controller 812 to establish the appropriate pin configuration in the memory interface 814 for accessing a given socket and memory module.

The flexible I/O port controller 812 establish the appropriate pin configuration in the memory interface 814 for accessing each given socket and memory module in response to control signals from the one or more I/O state machines 810.

The memory interface 814 establishes the state of its input/output buffers in response to controls from the port controller 812. Certain pins may be input only pins to received signals from the memory channel bus. Other pins may be output only pins with an output driver to drive out the signals to the memory channel bus. Still other pins, such as the data pins, may be bi-directional data pins that are selectively controlled to be input buffers when reading data off the memory channel bus and to be output buffers when writing data out to the memory channel bus.

The optional DMA controller 813 is for filling data buffers that may be included in the memory integrated circuits of the memory modules, such as the non-volatile memory integrated circuits. The optional DMA controller 813 uses direct memory access control to burst a sequence of data writes into memory modules or to burst read a sequence of data reads from a memory module into the memory controller. The DMA controller 813 instead may be a pre-fetch or cache controller with cache memory to decrease the latency for some type of memory modules.

Figure 8B:
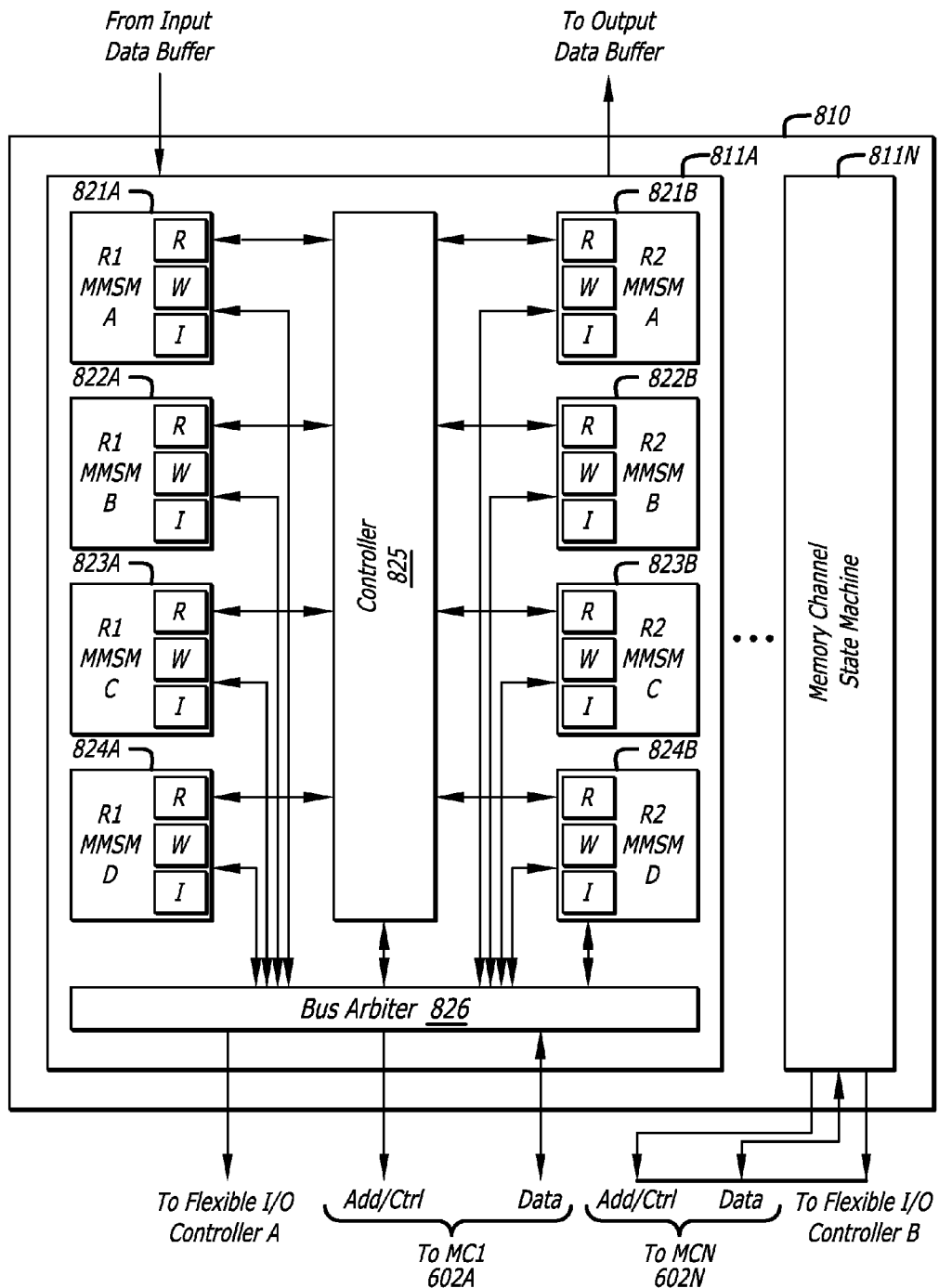

Referring now to FIG. 8B, further functional detail of the one or more I/O state machines 810 is now described. The one or more I/O state machines 810 includes a memory channel state machine 811A-811N for each memory channel 602A-602N coupled to the memory controller 800A. Each memory channel state machine 810A-811N includes a controller 825, a bus arbiter 826, and one or more memory module state machines 821A-824A,821B-824B coupled together as shown for each memory module and each rank of memory therein.

For example, memory module state machines 821A and 821B are for a memory module that may be coupled into socket A. Memory module state machine 821A is for rank 1 of memory in a dual inline memory module plugged into socket A. Memory module state machine 821B is for rank 2 of memory in the dual inline memory module that is plugged into socket A. There may be additional memory module state machines for three or more ranks of memory for each respective memory module. Similarly, memory module state machines 822A and 822B (including any additional memory module state machines for additional ranks) are for respective ranks of memory of a memory module that may be coupled into socket B. Memory module state machines 823A and 823B (including any additional memory module state machines for additional ranks) are for respective ranks of memory of a memory module that may be coupled into a socket C. Memory module state machines 824A and 824B (including any additional memory module state machines for additional ranks) are for respective ranks of memory of a memory module that may be coupled into a socket D and so on if additional sockets are available in a memory channel. While the programmable heterogeneous memory controller is being described here with respect to controlling access to a rank of memory assuming a homogeneous memory module, the memory controller may adapt to accessing different types of memory integrated circuits within one or more ranks of memory of a memory module. In that case, the memory module is a heterogeneous memory module being accessed by a programmable heterogeneous memory controller.

For non-volatile memory modules including non-volatile random access memory (NVRAM) integrated circuits, each of the memory module state machines 821A-824A,821B-824B (including any additional memory module state machines for additional ranks) has a different operational mode and sequence of operations if memory in a given rank of memory is being read accessed (R), write accessed (W), and initialized or erased (I). Each of the memory module state machines 821A-824A,821B-824B is programmed with the information from the memory module software driver corresponding to the type of memory module plugged into the associated socket. For example, memory module state machines 821A and 821B will be programmed with the memory module software driver corresponding to the memory module plugged into the associated socket A in memory channel 602A.

In the case of other types of memory modules, there may be no initialization or erase operational sequence of operations.

The controller 825 is coupled to each memory module state machines 821A-824A,821B-824B (including any additional memory module state machines for additional ranks) to control which memory module state machine is active and in which mode (read accessed (R), write accessed (W), initialized or erased (I)) in response to the type of access requested and the location of the memory module in the memory channel (e.g., which socket) that is being accessed.

The bus arbiter 826 is coupled to the controller 825 and each of the memory module state machines 821A-824A, 821B-824B (including any additional memory module state machines for additional ranks) to arbitrate access to the memory channel bus when the state machines try to communicate with their corresponding memory module.

Each of the memory module state machines 821A-824A, 821B-824B, along with the controller 825 and arbiter 826, generate the appropriate pin out configuration control signals to establish the proper pin out in the memory interface, the appropriate logic and timing of control signals, address signals, and data signals for reading and writing data over the memory channel bus into each memory module coupled thereto.

Methods for Heterogeneous Memory Channel Communication

Figure 12A:
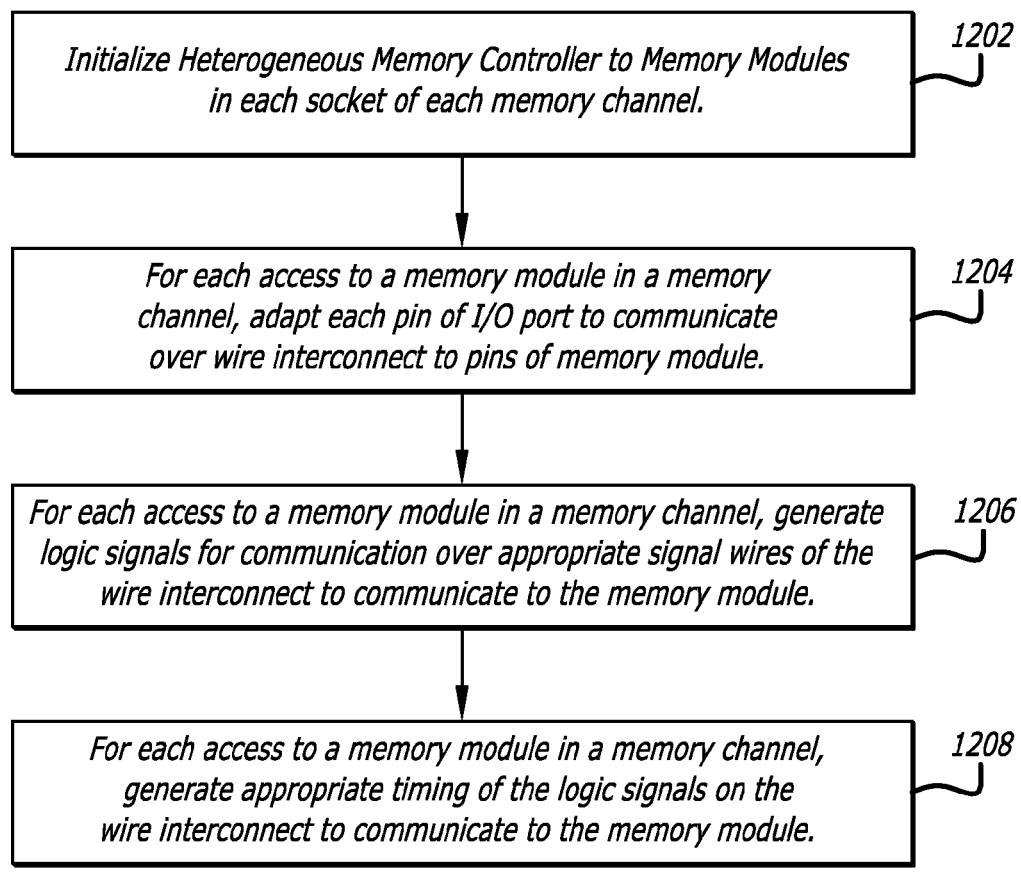
FIG. 12A is a flow chart of a method of heterogeneous communication in a memory channel having different types of memory modules.

FIG. 12A illustrates a flow chart of a method of communication to different types of memory modules in heterogeneous memory channels of a heterogeneous main memory.

At block 1202, a programmable heterogeneous memory controller is initialized. Each socket in each heterogeneous memory channel is polled to determine the different types of memory modules in each socket of each heterogeneous memory channel. The sockets in a heterogeneous memory channel may be vacant or empty in which case the programmable heterogeneous memory controller does not need a memory module driver for these sockets.

At block 1204, for each access to each different memory module in each heterogeneous memory channel, each pin of a memory channel interface is flexibly configured or adapted to communicate over wire interconnect of a memory channel bus to respective pins of each different memory module. This is in response to the type of memory module that is being accessed. Memory module software drivers may be used to flexibly adapt the pin configuration of the memory channel interface to the type of memory module that is being accessed. The memory channel interface may also be referred to as an input/output port.

To improve bandwidth in a heterogeneous memory channel, additional functionality may be assigned to underused or unused pins so that the communication protocol between some memory modules and the heterogeneous controller may be extended. Additional address control signal lines may be used to address additional ranks of memory or to address more complex types of memory or DIMM architectural extensions which allow much greater memory capacity. Moreover, a feedback pin may be defined for an underused or unused pin for each socket/memory module so that the programmable heterogeneous memory controller can receive status information from each memory module plugged into each socket in the heterogeneous memory controller. A status signal may be sent from each socket/memory module to the programmable heterogeneous memory controller so that it knows when each memory module may be accessed or not.

At block 1206, for each access to a different memory module in the heterogeneous memory channel, appropriate logic signals are generated for communication over the proper signal wires of the wire interconnect of the memory channel bus in order to communicate to a memory module. The appropriate logic signals are generated in response to the type of memory module that is being accessed at the time. For example, the logic signals may be active high signals or they may be active low signals depending upon the type of memory module being accessed. Thus, the appropriate logic signals to be generated may vary from memory module to memory module. Memory module software drivers may be used to flexibly change the generation of logic signals for communication over the memory channel bus in response to the type of memory module that is being accessed.

At block 1208, for each access to a different memory module in the heterogeneous memory channel, the logic signals are generated on the wire interconnect of the memory channel bus with appropriate signal timing to properly communicate with a memory module. The appropriate signal timing for driving logic signals onto the memory channel bus is responsive to the type of memory module that is being accessed at the time. That is, the appropriate signal timing may vary from memory module to memory module. Memory module software drivers may be used to flexibly change the signal timing of the generation of logic signals on the memory channel bus responsive to the type of memory module that is being accessed.

The programmable heterogeneous memory controller may be properly programmed for both write access and read access to each memory module in each socket of the heterogeneous memory channel in response to the type of memory module that is being accessed.

Figure 12B:
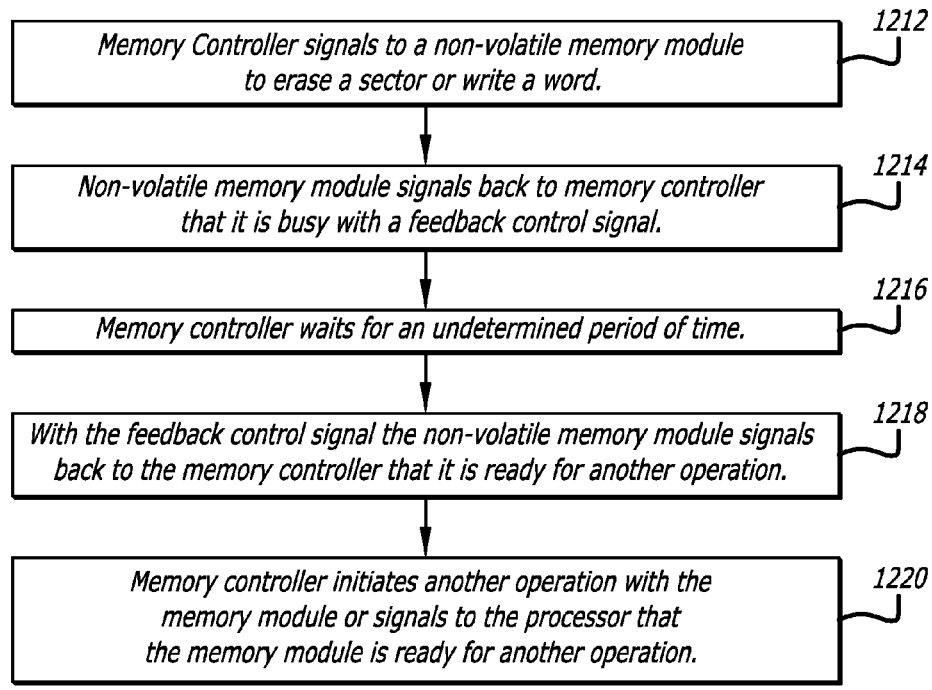
FIG. 12B is a flow chart of a method of communication to a non-volatile memory module in a memory channel.

Referring now to FIG. 12B, a flow chart of a method of communication to a non-volatile memory module in a memory channel is illustrated.

At block 1212, the processor tells the memory controller to signal a non-volatile memory module to erase a sector of non-volatile memory or write a word of data into non-volatile memory.

At block 1214, the non-volatile memory module being accessed signals back with a feedback status control signal that it is busy. The feedback status control signal from the memory module is coupled into the memory controller by way of a point-to-point wire interconnect in the memory channel bus. In some implementations, the feedback status control signal is the status signal 611F described herein.

At block 1216, the memory controller waits for an undetermined period of time due to the non-deterministic nature of the write and erase operations with the non-volatile memory module. That is, the memory controller waits for an indefinite period of time after receiving the feedback status control signal indicating busy.

At block 1218, the non-volatile memory module being accessed signals back with its feedback status control signal that it is now ready for another write operation or erase operation. A read operation may be performed by the non-volatile memory module into a different bank of memory while a write or erase operation is pending therein.

At block 1220, the memory controller initiates another operation with the memory module after the feedback status control signal is received. The memory controller may initiate another write access or erase a sector of non-volatile memory. Alternatively, the memory controller may interrupt the processor and signal that the non-volatile memory module is ready for another write or erase operation. The processor may also poll the feedback status control signal to await changes.

Figure 13:
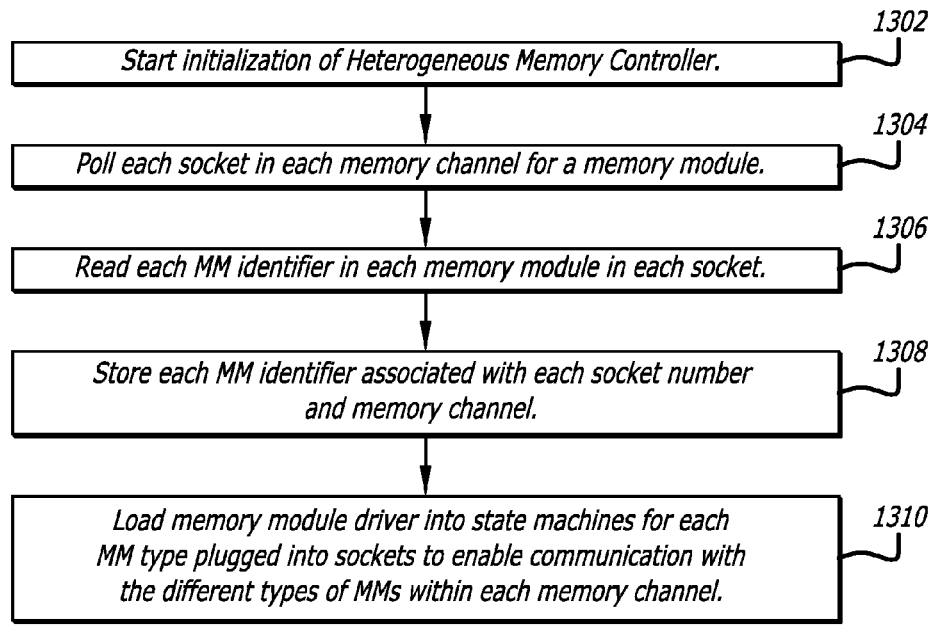
FIG. 13 is a flow chart of a method of initializing the programmable heterogeneous memory controller.

FIG. 13 illustrates a flow chart of a method of initializing the programmable heterogeneous memory controller.

At block 1302, the computer system is powered on or re-booted such that the initialization of the programmable heterogeneous memory controller can occur.

At block 1304, each socket in each memory channel of main memory is polled to determine if a memory module is plugged into a socket. After polling a socket, if no response is heard by the programmable heterogeneous memory controller it may assume that no memory module is plugged into the socket. The socket is empty or vacant. The programmable heterogeneous memory controller may store information regarding the vacant or empty sockets into registers or scratch-pad memory as in the main memory socket table illustrated in FIG. 10.

At block 1306, if a memory module is plugged into a socket, each memory module identification is read out and stored in association with its respective socket number or socket identifier. The memory module identification provides an indication of the type of memory module that is plugged into the socket. If a memory module identification cannot be read from a socket, the heterogeneous memory controller may try to communicate with the memory module assuming a different module type, and repeat the test until the known types of modules are exhausted.

At block 1308, after reading out the memory module identification, it is stored in association with its socket number and memory channel. The memory module identification may be stored into registers or a table in scratch pad memory of the programmable heterogeneous memory controller such as illustrated by the main memory socket table of FIG. 10.

At block 1310, memory module software drivers are loaded into the programmable heterogeneous memory controller and its one or more state machines to enable proper communication protocol with each of the different types of memory modules that may be coupled into each heterogeneous memory channel. If only one type of memory module is plugged into a memory channel, it is a homogeneous memory channel and only one memory module software driver may be required for proper communication to each.

If a memory module software driver is not available locally to the programmable heterogeneous memory controller, it may be acquired from a network source, such as the internet, or a software disk.

With the memory module software drivers coupled into the programmable heterogeneous memory controller and loaded into its one or more state machines, the programmable heterogeneous memory controller is initialized to access the different memory modules in each memory channel.

Translating Memory Modules for Heterogeneous Memory Channels

In the previous discussion, a programmable heterogeneous memory controller was used to flexibly adapt to communicate with different communication protocols to different types of memory modules in heterogeneous memory channels. However, newer memory modules may be designed to translate non-DDR signals into DDR signals so that prior DDR2 memory controllers may transparently communicate with newer memory modules of differing types.

Figure 1B:
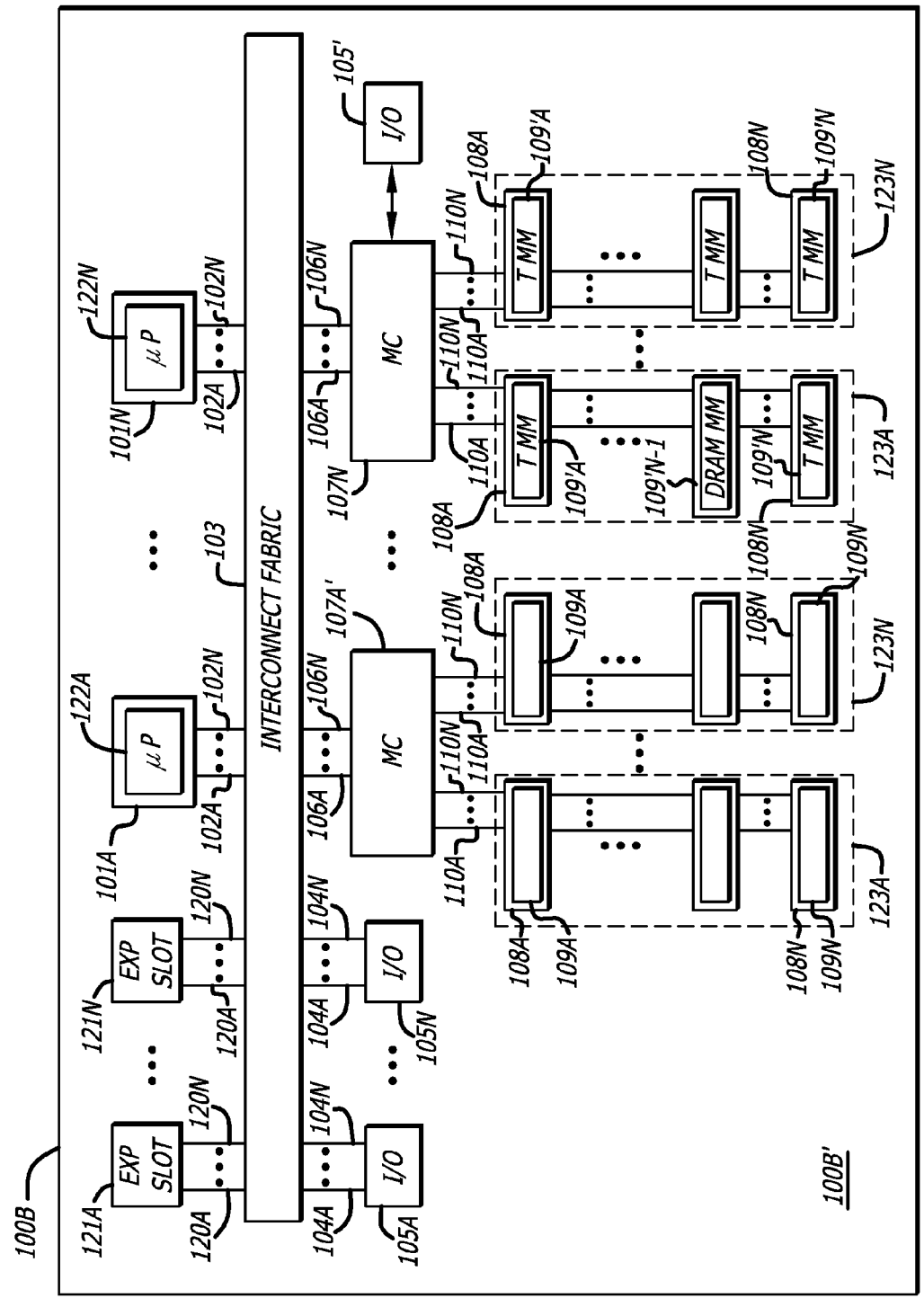
FIG. 1B is a functional block diagram of a computer system with a heterogeneous main memory including DRAM memory modules and translating memory modules with different types of memory.

Referring now to FIG. 1B, memory controllers 107A'-107N' may be standard DDR2 memory controllers to communicate with memory modules in accordance with the DDR2 specification over each memory channel bus. However, one or more of the memory modules 109A'-109N' plugged into sockets 108A-108N in the memory channels 123A-123N may be a translating memory module (TMM). In FIG. 1B, each of the memory modules 109A' is a translating memory module. Another memory module 109N-1' in the same memory channel may be a DDR2 standard DRAM DIMM such that the memory channel 123A is a heterogeneous memory channel with the memory controller 107N' be unaware. The translating memory module (TMM) is designed to translate non-DDR signals into DDR signals for communication over each memory channel bus in a transparent manner to the memory controllers 107A'-107N'.

Figure 4C:
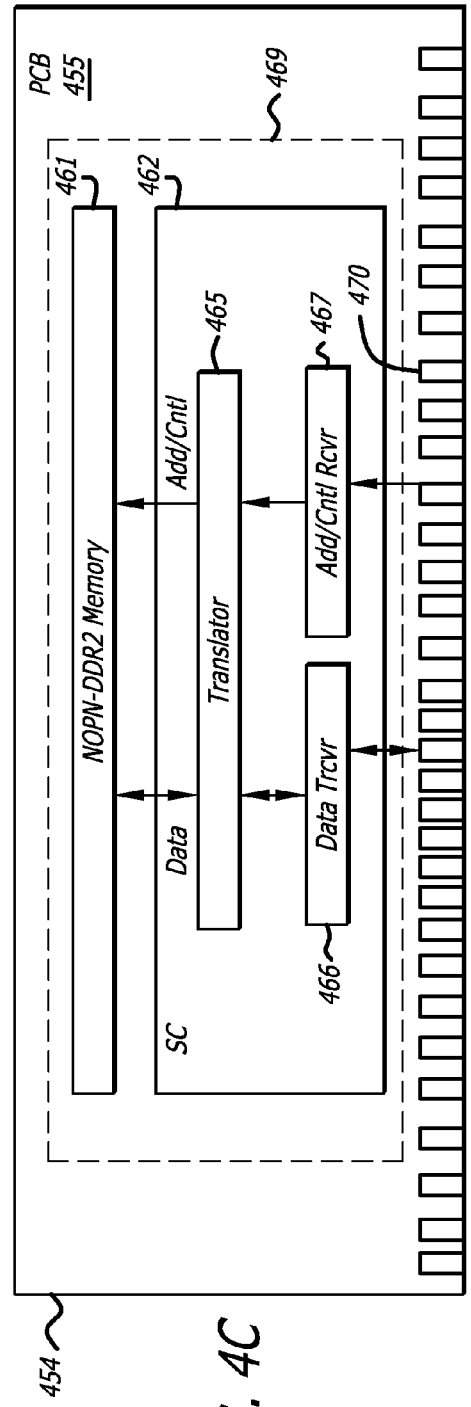
FIG. 4C is a functional block diagram of a translating memory module.

Referring now to FIG. 4C, a functional block diagram of a translating memory module (TMM) 454 is illustrated. The translating memory module 454 includes a printed circuit board 455 with a non-DDR2 memory device 461 and a support chip 462 coupled thereto. One or several non-DDR2 memory devices 461 and the support chip 462 may be co-packaged together into one integrated circuit package 469 and mounted to the printed circuit board 455. A plurality of non-DDR2 memory devices 461 and a plurality of support chips 462 may be coupled to the PCB 455. The support chip 462 is coupled to the PCB 455 between the non-DDR2 memory 461 and pads of an edge connector 470. The pads of the edge connector 470 may be formed as part of the PCB 455. Otherwise a separate edge connector may be soldered to the PCB 455.

The support chip 462 includes a translator 465, a data transceiver (transmitter and receiver) 466 and an address/control receiver 467 coupled together as shown. The translator 465 is coupled between the non-DDR2 memory 461 and the data transceiver 466 and the address/control receiver 467.

The data transceiver 466 and the address/control receiver 467 bi-directionally interface the memory module 434 to the memory channel bus using DDR2 address, control, and data signaling.

The translator 465 is a bi-directional translator. The translator 465 translates non-DDR signals into DDR2 signals for communication over the memory channel bus in a transparent fashion to the memory controller. DDR2 signals received from the memory channel bus are translated as required by the translator 465 into non-DDR2 signals which the non-DDR2 memory 461 understands. In this manner, a non-DDR2 memory device in a memory module may communicate using a pre-existing memory channel bus and pre-existing memory controller.

CONCLUSION

While this specification includes many specifics, these should not be construed as limitations on the scope of the disclosure or of what may be claimed, but rather as descriptions of features specific to particular implementations of the disclosure. Certain features that are described in this specification in the context of separate implementations also may be implemented in combination in a single implementation. Conversely, various features that are described in the context of a single implementation also may be implemented in multiple implementations separately or in sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

A number of implementations have been described. Nevertheless, it will be understood that various modifications may be made without departing from the spirit and scope of the disclosure. Other implementations are within the scope of the following claims. For example, the memory modules and the memory sockets have been described as being dual in-line memory modules (DIMM) and DIMM sockets. However, the memory modules and memory sockets may have other types of form factors, such as single in-line memory modules (SIMM), for example.

What is claimed is:

1. A method of communicating to different types of memory modules in a memory channel, the method comprising:
   initializing a programmable heterogeneous memory controller to each memory module coupled to a memory channel bus;
   adapting each pin of a memory channel interface to communicate over wire interconnect of the memory channel bus to respective pins of each memory module in response to a differing pinout for each different type of memory module being accessed;
   generating logic signals for communication over the wire interconnect of the memory channel bus to each memory module in response to differing signal levels for each different type of memory module being accessed;
   wherein the logic signals are generated on the wire interconnect of the memory channel bus with appropriate signal timing to communicate with each memory module in further response to differing signal timing for each different type of memory module being accessed; and
   wherein address and control signal lines are used in a different manner to address additional memory to increase memory capacity.

2. The method of claim 1, further comprising:
   loading into the heterogeneous memory controller one or more memory module software drivers associated with the type of memory modules being accessed.

3. The method of claim 2, further comprising:
   downloading at least one of the one or more memory module software drivers over a network.

4. The method of claim 2, wherein
   in response to each different type of memory module being accessed, the one or more memory module software drivers each include information regarding the respective pins of the memory module, logic signals to communicate with the memory module, and signal timing to communicate with the memory module.

5. The method of claim 1, wherein
   the adapting of each pin includes
      assigning additional functionality to underused or unused pins so that a communication protocol between one or more memory modules and the programmable heterogeneous memory controller may be extended.

6. The method of claim 5, wherein
   a feedback pin is defined so that the programmable heterogeneous memory controller can receive status information from the memory module.

7. The method of claim 1, wherein
   the generating of logic signals includes
      generating active high logic signals or active low logic signals in response to the type of memory module being accessed.

8. The method of claim 1, wherein
   the initializing of the programmable heterogeneous memory controller includes
      polling each socket in the memory channel for a memory module;
      reading a memory module identification from each memory module to determine the type of memory module coupled into each socket; and loading a memory module software driver into the programmable heterogeneous memory controller for each different type of memory module coupled into the memory channel.

9. The method of claim 8, wherein
the initializing of the programmable heterogeneous memory controller further includes
storing each memory module identifier associated with each socket into the programmable heterogeneous memory controller.

10. The method of claim 9, wherein
the initializing of the programmable heterogeneous memory controller further includes
loading a state machine with the memory module software driver to access the memory module in a given socket.

11. A method of communicating to different types of memory modules in a memory channel, the method comprising:
initializing a programmable heterogeneous memory controller to each memory module coupled to a memory channel bus;
adapting each pin of a memory channel interface to communicate over wire interconnect of the memory channel bus to respective pins of each memory module in response to each different type of memory module being accessed;
utilizing pre-existing address pins over multiple cycles to form a larger address to address additional memory and increase memory capacity;
generating logic signals for communication over the wire interconnect of the memory channel bus to each memory module in response to each different type of memory module being accessed; and
wherein the logic signals are generated on the wire interconnect of the memory channel bus with appropriate signal timing to communicate with each memory module in response to each different type of memory module being accessed.

12. The method of claim 11, wherein
the generating of logic signals includes
generating active high logic signals or active low logic signals in response to the type of memory module being accessed.

13. The method of claim 11, wherein
the initializing of the programmable heterogeneous memory controller includes
polling each socket in the memory channel for a memory module;
reading a memory module identification from each memory module to determine the type of memory module coupled into each socket; and
loading a memory module software driver into the programmable heterogeneous memory controller for each different type of memory module coupled into the memory channel.

14. The method of claim 13, wherein
the initializing of the programmable heterogeneous memory controller further includes
storing each memory module identifier associated with each socket into the programmable heterogeneous memory controller.

15. The method of claim 14, wherein
the initializing of the programmable heterogeneous memory controller further includes
loading a state machine with the memory module software driver to access the memory module in a given socket.

* * * * *